United States Patent [19]

Bhaskar et al.

[11] 4,455,654

[45] Jun. 19, 1984

[54] TEST APPARATUS FOR ELECTRONIC ASSEMBLIES EMPLOYING A MICROPROCESSOR

[75] Inventors: Kasi S. Bhaskar, Edmonds; Alden J. Carlson, Bothell, both of Wash.; Alastair N. Couper, Honolulu, Hi.; Dennis L. Lambert, Bothell; Marshall H. Scott, Woodinville, both of Wash.

[73] Assignee: John Fluke Mfg. Co., Inc., Everett, Wash.

[21] Appl. No.: 270,926

[22] Filed: Jun. 5, 1981

[51] Int. Cl.³ .............................................. G06F 11/22
[52] U.S. Cl. ..................................... 371/20; 324/73 R
[58] Field of Search ............................. 371/20, 25, 29; 324/73 R, 73 AT

[56] References Cited

U.S. PATENT DOCUMENTS

| | | | |
|---|---|---|---|
| 4,125,763 | 11/1978 | Drubing et al. | 371/20 |
| 4,192,451 | 3/1980 | Swerling et al. | 371/20 |
| 4,228,537 | 10/1980 | Heackels et al. | 324/73 R X |
| 4,300,207 | 11/1981 | Eivers et al. | 324/73 R X |
| 4,339,801 | 7/1982 | Hosaka et al. | 371/20 X |

OTHER PUBLICATIONS

Anderson et al. "Processor-Based Tester Goes on Site to Isolate Board Faults Automatically" *Electronics* May 11, 1978, pp. 111–117.

*Primary Examiner*—David H. Malzahn
*Attorney, Agent, or Firm*—James W. Anable; Mikio Ishimaru; Stephen A. Becker

[57] ABSTRACT

A test system for functionally testing and troubleshooting microprocessor-based systems and assemblies is disclosed wherein the test system is connected in place of the microprocessor circuit of the unit being tested (UUT). The test system is itself a microprocessor-based system and includes a microprocessor circuit which is supplied with the UUT clock signal and is the same type of microprocessor circuit as is utilized by the UUT. The test system periodically switches this microprocessor into signal communication with the UUT for a single UUT bus cycle to perform UUT read or write operations. During remaining time periods, the test system microprocessor circuit is in signal communication with the remaining portion of the test system to analyze data obtained from the UUT bus during the previous UUT write or read operation and to establish the signals to be used in the next UUT write or read operation. Various test sequences are provided for testing the UUT bus, RAM, ROM, and write-responsive I/O registers. In addition, a mode of operation is provided wherein the test system interrogates a fully functional assembly of the type to be tested to derive a memory map and test parameters that permit the test system to perform RAM, ROM, and I/O tests without prior knowledge of the UUT operational sequence or allocation of address space. A test probe provides a visual indication that the logic level at a monitored circuit node is high, low, invalid, or is a sequence of pulses of all three logic levels. The test probe also provides for injection of logical high pulses, logical low pulses or an alternating pulse sequence of high and low pulses. Probe logic level detection and pulse injection can be asynchronous or can be selectively synchronized so that logic level detection or pulse injection occurs with each UUT write or read operation.

56 Claims, 4 Drawing Figures

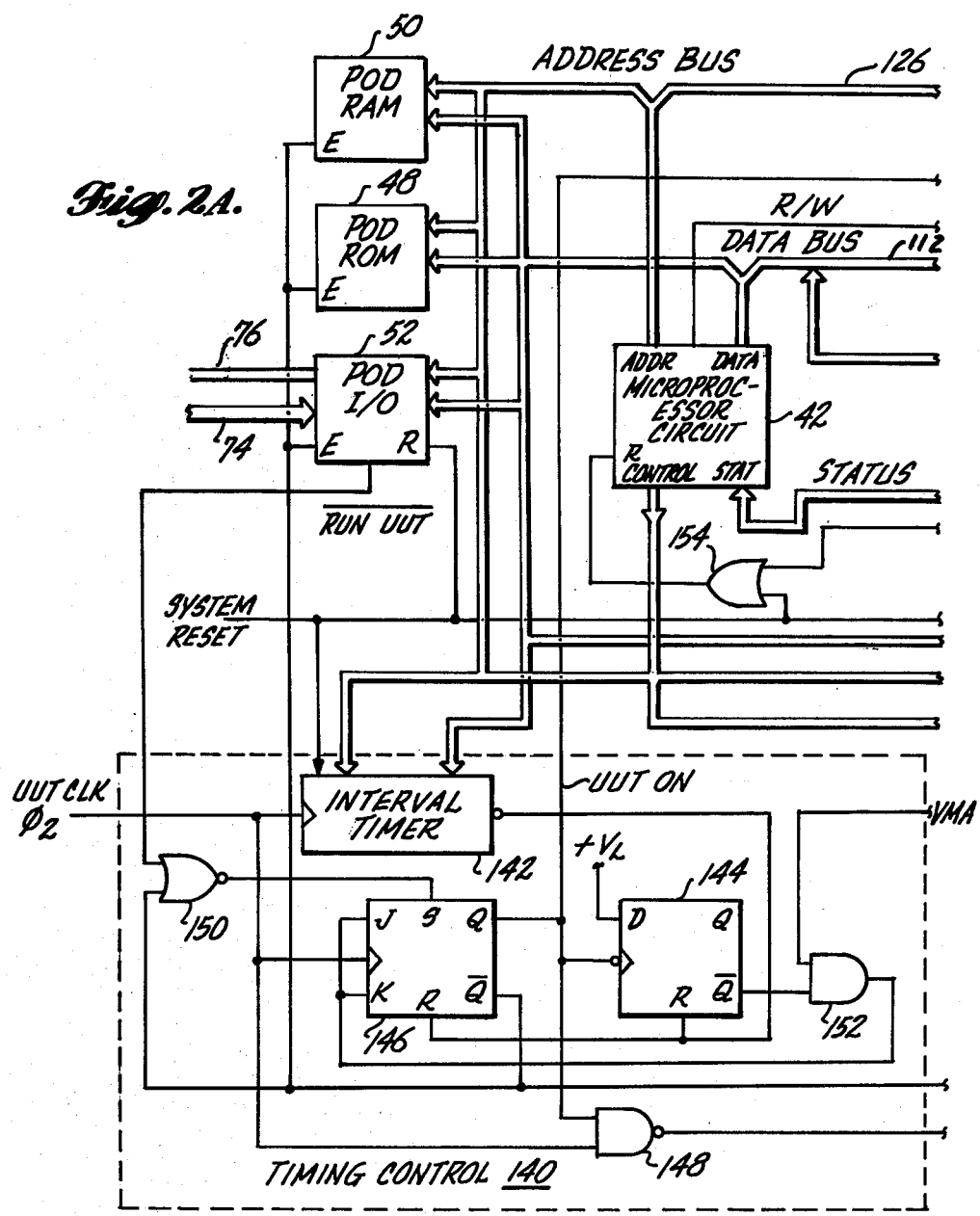

TEST APPARATUS FOR ELECTRONIC ASSEMBLIES EMPLOYING A MICROPROCESSOR

BACKGROUND OF THE INVENTION

This invention relates to apparatus and methods for the functional testing and troubleshooting of electronic circuitry. More specifically, this invention relates to electronic test equipment that is configured for use in the testing and repair of instruments, systems and assemblies that include a microprocessor circuit.

As is known to those skilled in the digital electronics arts, a microprocessor-based electronic system or assembly includes an integrated circuit known as a microprocessor which functions as a central processing unit (CPU) and which is interconnected with one or more random access and read only memory circuits (RAM's and ROM's) by means of the system bus structure which carries a stream of parallel format, digitally-encoded data words between the system components. In addition, each such assembly includes one or more input/output (I/O) circuits which permit data to be coupled into and out of the microprocessor-based system from a wide variety of input and output devices such as manually-operated keyboards and switches, information display devices, analog-to-digital converters, digital-to-analog converters, and various types of transducers that provide signals representative of the desired system stimuli and/or respond to an alarm or control signal provided by the microprocessor-based electronic system. As is also known to those skilled in the art, a microprocessor-based system or assembly often includes other types of digital circuit arrangements such as buffer stages, decoding networks and variously-configured arrangements of logic gates.

Since microprocessor-based systems are structurally simpler than comparable circuits employing discrete logic circuits that are arranged to exhibit the same or similar operational capabilities and since microprocessor-based systems can be manufactured at relatively low cost, the use of such systems has grown dramatically and continues to grow as new microprocessor-based products are developed and as new microprocessor circuits and associated memory devices of increased signal-processing capability become available. In this regard, the use of microprocessor-based systems has not been limited to replacements for electronic systems and assemblies that were previously realized by relatively complex arrangements of discrete logic circuitry but, in fact, has resulted in a wide variety of new products including small computers for business and home use and electronic games. Moreover, since microprocessor-based arrangements exhibit a relatively high reliability factor and can be manufactured at a relatively low cost, such circuits and systems are rapidly replacing electromechanical arrangements such as, for example, the control and timer assemblies used in home appliances, the electromechanical arrangements of pinball and various gaming machines, and the electromechanical computing and tabulation assemblies utilized within cash registers, typewriters and other business machines.

Although microprocessor-based systems and assemblies have numerous advantages from the standpoint of both the manufacturer and the system user, such systems exhibit certain disadvantages and drawbacks relative to the testing and troubleshooting that is necessary to maintain satisfactory quality control during the manufacturing process and to effectively maintain and repair such a system once it has been placed in service. In this regard, since the system primarily consists of integrated circuits that are interconnected with one another by means of the system bus structure, relatively few test points are available. Moreover, very few system failures can be detected by testing relatively static signal conditions within the system and satisfactory testing and troubleshooting requires the detection of system control, status, addressing and data signals which appear on the system bus as a rapidly changing series or string of digitally-encoded data words. Since the system bus is bidirectional, with data signals being coupled to and from various system components, traditional testing concepts which simply involve stimulating a device in a controlled manner and monitoring the response thereto becomes a relatively complex task.

Because of the above-mentioned factors, apparatus which permits an operator to access and examine various signals in a microprocessor-based assembly or system has not satisfied the need for test equipment which can be used in a wide variety of situations ranging from manufacturing tests of electronic assemblies and subassemblies to field service and repair of completed units. For example, to facilitate the design of microprocessor-based electronic assemblies and systems, the microprocessor manufacturers and others have developed relatively complex apparatus generically known as microprocessor development systems which permit an operator to interact with a microprocessor system by, for example, selectively establishing address and control signals as well as the value of ROM-stored signals as he or she sequentially steps through the microprocessor logic sequence or program. Moreover, most microprocessor development systems allow the operator to store a sequence of digitally-encoded signals that appear on the system bus between any two specific system states such as selected address signals, specified system command signals or specified states of the system data bus. The stored information can then be examined to locate programming faults.

Although microprocessor development systems provide substantial assistance in designing microprocessor-based systems by allowing the system designer to establish, evaluate and debug the system programming, such apparatus is of little use in manufacturing and field service environments since hardware-related faults and failures are not located. Moreover, satisfactory operation of such equipment requires an in-depth understanding of the manner in which the microprocessor-based system or assembly being tested is programmed and sequenced and requires substantial training and experience in the design and analysis of programmed apparatus.

To extend the capabilities of microprocessor development systems so as to permit the detection and isolation of hardware-related faults and failures, such systems have been combined with "in-circuit emulation" techniques wherein the test arrangement is configured to replace the microprocessor circuit of the system or assembly being tested. Interconnected in this manner, the test arrangement operates in conjunction with the assembly being tested to execute diagnostic routines or programs that are organized to detect operational faults and, in many cases, to isolate the fault to a particular component or group of components. The instructions and data utilized in these diagnostic tests are generally stored in the memory of the microprocessor development system, and are coupled to the microprocessor bus during the in-circuit emulation routine.

A third prior art approach, which has been applied alone and in combination with in-circuit emulation arrangements is known as "signature analysis". In signature analysis, a known, predetermined bit stream is applied to a sequential digital circuit of interest and the circuit response is collected and processed to form a hexadecimal value (a "signature") that is uniquely associated with that bit stream. By comparing the signature obtained when a unit under test is stimulated by the appropriate bit stream with the proper signature for that particular data path and stimulus, system malfunctions can be detected and, in some cases, the fault can be isolated to a particular semiconductor device or component. This method reduces the complexity of analysis of test data so that this test apparatus can be operated by less skilled personnel.

Diagnostic and testing programs have not proven entirely satisfactory regardless of whether the diagnostic system is completely internal to the microprocessor-based system or is effected through in-circuit emulation. In this regard, diagnostic programs that isolate system failures to a satisfactory level (e.g., to a particular printed circuit board in a relatively complex system or to a component level in the less complex arrangements) often require a development effort comparable to that required to develop the microprocessor-based system itself. Typically, the manufacturers of microprocessor-based systems and assemblies have been willing and competitively able to undertake such a task with respect to only the most complex and sophisticated types of systems and, because of the problems involved, have developed diagnostic and testing arrangements primarily for the type of microprocessor-based systems which are customarily serviced by the system manufacturer or its representatives. Further, not only does the establishment of effective diagnostic and testing routines require an in-depth knowledge and understanding of the arrangement being tested, but such testing arrangements preempt at least a portion of the memory circuits of the system or assembly to be tested, with the amount of system memory that is "lost" being minimized by the use of the above-mentioned diagnostic programs and in-circuit emulation techniques which include diagnostic routines that are stored in the test arrangement. More importantly, however, prior art diagnostic tests require that at least a portion of the unit being tested must be fully operational in order to execute the test procedures. For example, certain failures that cause one or more bits of the system bus to exhibit an unalterable logic state or other bus failures and conditions such as short circuits can easily prevent the execution of a diagnostic routine that is provided by incircuit emulation or by programming and hardware that is an integral part of the unit under test.

All of the above-mentioned considerations and problems associated with testing microprocessor-based assemblies and systems are compounded for the system user or any other business entity which attempts to service and maintain such systems and assemblies. In particular, these business entities may have to deal with systems or assemblies that employ different types of the various commercially-available microprocessor circuits. Additionally, even though personnel that are proficient in the programming of microprocessor-based systems may be available, the documentation required to establish suitable test procedures may not be available from the manufacturer of the assembly system. Even further, a manufacturer may make changes and modifications in a microprocessor-based system or assembly that affect the test routines established by the user, thereby disrupting a test program until adequate documentation is obtained and suitable changes in testing are implemented. Although some efforts have been made to provide test arrangements that can be adapted for use with assemblies that employ different types of microprocessor circuits, all prior art test arrangements appear to require at least some knowledge of the manner in which the unit to be tested is programmed or sequenced.

Accordingly, it is an object of this invention to provide apparatus for the testing and troubleshooting of microprocessor-based systems and assemblies wherein the test apparatus is suitable for use in various environments including the manufacturing test environment, use at regional repair centers and use as a field service instrument.

It is another object of this invention to provide apparatus for the testing and troubleshooting of microprocessor-based systems which can be operated without substantial training or knowledge in the design and operation of microprocessor-based systems and/or the sequencing or programming employed in the particular system or assembly to be tested.

It is still another object of this invention to provide apparatus for testing microprocessor-based assemblies and system which does not require or rely upon data or instructions stored within the unit to be tested or require the use of or "pre-empt" the use of the unit RAM.

It is yet another object of this invention to provide test apparatus for the testing and troubleshooting of a microprocessor-based system or assembly wherein the test apparatus remains functional and detects malfunctions appearing at or caused by the bus structure of the unit being tested.

Even further, it is an object of this invention to provide a test arrangement for microprocessor-based systems wherein the test arrangement can effect relatively extensive functional testing of such a system without any knowledge of the manner in which the system memory circuits are organized and accessed or the manner in which the unit to be tested is programmed or sequenced.

Additionally, it is an object of this invention to provide a test arrangement that meets the above set forth objects while being readily adaptable for testing systems and assemblies that utilize substantially any type of commercially available microprocessor circuit.

SUMMARY OF THE INVENTION

These and other objects are achieved in accordance with this invention by a test arrangement which is, itself, a microprocessor-based system that is connected in place of the microprocessor of the unit under test (referred to hereinafter as the "UUT"). The microprocessor circuit of the test arrangement does not, however, simply replace the microprocessor of the UUT to thereby permit execution of the normal UUT operational sequence or execution of a special diagnostic test program although the presently-preferred embodiments provide such an optional mode of operation. In particular, in accordance with this invention, the microprocessor of the test arrangement is, in effect, sequentially switched between a first operational state in which it is not interconnected with the UUT and a second state of operation wherein the microprocessor interconnects with and controls operation of the UUT. More specifically, in this first operational state, the microprocessor operates in conjunction with the memory circuits and various other circuit components that comprise the test arrangement to either: (a) formulate the stimulus for the next period of time in which the microprocessor is coupled to the UUT; or (b) analyze the digitally-encoded response of the UUT to a previously-applied test stimulus. In the second operational state wherein the microprocessor is interconnected with the UUT, the stimulus derived or established by the test arrangement is applied to the UUT and the UUT response signal is stored in latch circuits for subsequent analysis by the test arrangement. Since the test arrangement of this invention utilizes the UUT clock signal, switching between the above-mentioned states and all other test operations can be synchronized with the operation of the UUT and the portion of the test activity that takes place within the UUT occurs at a rate that is identical to that experienced during normal operation of the UUT.

To facilitate use with various types of microprocessor circuits, this invention is configured and arranged so that the microprocessor circuit and the associated memory devices, interface circuits and other digital logic circuits which are specifically configured for testing a system or assembly that employs a particular type of microprocessor are located within a portion of the test arrangement that is referred to as the interface pod. With this configuration, the interface pod is interchangeable and a system or assembly that employs a particular type of microprocessor is tested by connecting an appropriately configured interface pod to a main frame assembly that contains a keyboard, an alphanumeric display unit and various associated circuits that will be discussed in describing the detailed embodiments of the invention. The interface pod is then connected to the UUT by means of an interface pod cable assembly which includes a connector which mates with the microprocessor socket of the UUT. In situations wherein the UUT microprocessor is soldered into a printed circuit board or installed in some other manner that prevents ready removal of the microprocessor circuit, a test socket can be temporarily or permanently mounted on the UUT and the UUT microprocessor circuit can be disabled by numerous known techniques.

Regardless of the method employed to connect the test system interface pod with the UUT, the hereinafter-discussed presently-preferred embodiments in the invention are configured and arranged to selectively execute several different sequences that functionally test the UUT interconnection bus, the UUT RAM circuits, the UUT ROM circuits and the UUT I/O circuits. In addition, the interface pods of the presently-preferred embodiment of the invention include a voltage sensing circuit that performs a go/no-go evaluation of the UUT microprocessor power supply voltage or voltages when the test system is interconnected to a UUT and energized. In this regard, if power supply voltage appropriate to the type of microprocessor employed by the UUT (and hence within the test system interface pod) are not present, a power supply failure warning is generated by the alphanumeric display unit that is contained in the test set main frame assembly. Upon verification of the proper microprocessor power supply voltages, the test set operator can initiate any one of the above-mentioned functional tests or, can initiate test set operation in a "auto-test" mode wherein the test arrangement sequences through all of the listed functional tests. Since the test arrangement utilizes the UUT clock signal, initiation of the requested test sequence provides verification that the UUT clock circuit is operational.

If the test set operator selects the auto-test mode or follows the testing sequence most appropriate to testing a UUT of unknown operational condition, the test sequence for determining the condition of the UUT bus structure is conducted after proper operation of the UUT microprocessor power supply and the clock has been verified. During this bus test sequence, the test arrangement sequentially alternates between the previously-discussed states that selectively interconnect the interface pod microprocessor circuit with the remaining portion of the test arrangement or with the UUT. Operating in this manner, a test arrangement constructed in accordance with this invention generates digitally-encoded test stimuli or signals that are directed to the UUT bus when the microprocessor circuit is, in effect, switched into communication with the UUT bus and the digitally-encoded signal that indicates the state that the bus attains in response to each generated test signal is stored in a set of latch circuits during the period of time in which the interface pod microprocessor is coupled to the UUT. When the microprocessor circuit is, in effect, switched back into the state in which it interacts with the remaining portion of the test arrangement, the data word contained in the latch circuits is coupled to the microprocessor for analysis or for comparison with reference signals stored in the test arrangement ROM. If an error or malfunction is not detected, the sequence continues with the microprocessor circuit fetching the next address and data signal of the test sequence and being switched so as to couple the test stimulus to the UUT. By employing a test sequence that supplies many potential UUT addresses and by utilizing a specific test signal at each of the accessed addresses, the bus-test sequence of the present invention detects and specifically identifies UUT control lines, address lines, and data lines that cannot be driven to a logical high or logical low level (i.e., control, address and data lines that are "stuck" at a logical high or a logical low by, for example, a failure within one of the UUT-integrated circuit stages or an inadvertent signal path caused by the presence of conductive foreign material such as residue from a soldering operation). Moreover, as is described in more detail hereinafter, the bus test sequence of the present invention detects and specifically identifies short circuits between two or more UUT data lines and/or short circuits between two or more address lines. Once a unit being tested has passed the power supply, clock signal and bus test sequences, the test system will automatically initiate functional testing of the UUT ROM circuits if the test arrangement is being operated in the auto-test mode and as long as the UUT clock is functional. If the test arrangement is not in the auto-test mode the operator can manually initate a sequence for testing the UUT ROM circuitry, the UUT RAM circuitry, or the UUT I/O circuitry in the order desired.

Basically, the ROM, RAM and I/O test sequences are conducted in the same manner as the above-described bus test sequence with the interface pod microprocessor circuit being, in effect, sequentially switched between first and second operating states wherein the microprocessor circuit is alternately operated with the remaining circuitry of the test arrangement or is interconnected to the UUT bus to provide a desired stimulus and obtain the UUT response thereto. In this regard, during the ROM test sequence, the test arrangement accesses each byte of storage provided by the UUT ROM circuits and reads the stored data. With each step of the sequence, the stored signal that is returned to the test arrangement from the UUT is processed and accumulated in a manner that results in a hexadecimal signal or "signature" that uniquely represents the information stored in each particular block or unit of the UUT ROM circuitry. As shall be discussed relative to the hereinafter-disclosed embodiments of the invention, the hexadecimal signal obtained in this manner is similar to the signal obtained during signature analysis of a sequential data system and permits the test arrangement of this invention to detect and identify problems and malfunctions within each block or group of UUT ROM by comparing the hexadecimal signature obtained during the test sequence with the hexadecimal signature that is obtained with a UUT having fully operational blocks of ROM.

The presently-preferred embodiments of the invention are configured and arranged for performing a first RAM test sequence wherein the test arrangement sequentially supplies each address that is associated with RAM storage to: (a) verify that binary ones and zeroes can be written into each data bit of RAM storage; (b) determine that none of the data lines of the RAM units are shorted together; and (c) detect decoding errors within each block or group of RAM addresses. If an error is detected at any step of this sequence, the test arrangement generates a display signal that reports the error condition and the RAM storage location associated therewith. In addition, the presently-preferred embodiments of the invention include a second RAM test sequence which includes the above-mentioned RAM test for determining that ones and zeroes can be written into each RAM storage location and the test for determining that the data lines are not shorted; as well as a more thorough check for decoding errors and a relatively elaborate pattern sensitivity test wherein the test arrangement generates a wide variety of data words and determines that each of these words can be written at each address of UUT RAM storage without altering data that is stored at the remaining storage locations.

The I/O test sequence utilized in the invention is similar to that portion of the above-described RAM test sequences which determines whether a binary one and zero can be written into every data bit that is associated with each RAM memory address. Typically, only certain bit locations of an I/O register respond to test stimuli that attempts to force the data line associated with that address to a logical high state or a logical low state. In accordance with this invention, the test arrangement sequentially switches between the two previously-mentioned operational states so that the microprocessor circuit accesses each I/O bit location that can be written into and ascertains whether stimuli for writing binary ones and zeroes cause the I/O register to store the proper signal. If a failure occurs at any particular step of the I/O test sequence, a signal is provided to the test arrangement main frame which results in an indication of the failure and the failing I/O address and bit number.

It can be recognized that the above-discussed sequences for testing the UUT ROM, RAM and I/O circuits require knowledge of the appropriate address signals and, with respect to the ROM test, a reference value or signature associated with a properly functioning unit. In accordance with this invention, this necessary test information can be provided through three alternative manners. First, the presently-preferred embodiments of the invention are programmed to permit the test operator to supply the necessary addresses and ROM signatures via the main frame keyboard. Alternatively, such information can be loaded into a random access memory unit from conventional data storage media such as tape or disc prior to initiation of the desired test sequences. Although various techniques can be employed it has been found advantageous to configure the presently-preferred embodiments of the invention so that the test set alphanumeric indicators display a message requesting appropriate address and ROM signature values whenever the test operator has selected the ROM, RAM or I/O test sequences. In this arrangement, the operator can respond to such a request by entering the desired information or by simply depressing a key which causes the system to default to the initial ROM, RAM or I/O address and associated data that is currently stored within the test system memory.

The third manner in which the present invention supplies the addresses and ROM signature values that are required for the above-discussed test sequences does not require knowledge of the manner in which the UUT memory space is organized or knowledge of the information that is stored in the UUT ROM units. In particular, the present invention is configured and arranged for operation in a "LEARN" mode wherein the test arrangement automatically interrogates a properly functioning microprocessor-based system or assembly of the type to be tested and determines the necessary address and ROM signature information. In the sequence employed in the LEARN mode of operation, the test arrangement alternately switches states so as to interconnect the interface pod microprocessor circuit with the remaining portion of the test arrangement or with the system or assembly that is being utilized for obtaining the necessary address and ROM signature information. During this test sequence, the test arrangement generates all potential address signals and determines whether an attempt to write information and then recall written information at each of these addresses is totally or partially successful or unsuccessful. If the unit being tested responds to write signals over an address range that encompass a predetermined minimum number of bytes (64 in the presently-preferred embodiments) that particular portion of the memory space of the unit to be tested is identified as being random access memory. If it is determined that the test arrangement can successfully write into an address range of less than the predetermined number of bytes or if it is possible to only write into a portion of the bit locations of a particular address, the associated address or addresses are tentatively identified as input/output ports (I/O). On the other hand, if the data at each address of an address range is independent of the data written at that address and if the data does not remain constant throughout the address range or exhibit certain patterns of regularity, that group of addresses is tentatively identified as ROM and the test arrangement automatically computes the above-mentioned ROM signature for each block of ROM that is detected (i.e., each group of consecutive addresses that are classified as ROM).

As is well-known to those skilled in the art, the address space of a microprocessor-based assembly or system is usually not completely occupied by RAM, ROM and I/O registers. In this regard, when less than one-half of the available address codes are required, it is common practice to utilize less than the full number of available address lines. In some situations an unused address line will be employed to perform another function such as "chip selection", i.e., as a selection line to enable and disable various integrated circuits within the microprocessor-based assembly or system. If such an unused address line is not utilized for a function such as chip enable, the corresponding bit of the system address code will be a "don't care bit" in that the same circuit element will be accessed regardless of the logic level that is applied to that address line. If a UUT address line is either totally unused or used as a chip enable, then each address that accesses an I/O register or a storage location within RAM or ROM may have one or more ∫aliased addresses" which will access the same circuit element.

To minimize the memory map (the description of the UUT's address space) generated during the LEARN mode and thereby minimize the amount of memory required to store the map and also eliminate redundant, time-consuming tests of the same UUT components when the map is utilized in executing one of the previously-discussed tests, the sequence utilized in the LEARN mode of the presently-preferred embodiments of the invention generates an aliasing indicator as each group of addresses is classified as RAM, ROM, or I/O. In this regard, as each subblock (the small range of addresses which have some common characteristics) is classified, the starting address and the aliasing indicator thereof are compared with the ending address and aliasing indicator of other subblocks of the same type that were derived during an earlier portion of the LEARN sequence. If the lowermost address of a newly-derived subblock exceeds the uppermost address of an identical subblock by the address increment of the UUT microprocessor, the two subblocks are combined to form a single, large subblock. If comparison of the aliasing indicators for a new subblock and subblocks of the same type reveals that the memory map already includes address codes for accessing the newly-derived subblock, the newly-derived subblock is not added to the memory map. Furthermore, if it is determined that a new subblock is a better descriptor (or describer of a portion of the UUT address space) for a component of memory than an existing descriptor, the included address codes are deleted from the existing descriptor. This could involve adjusting the limits of that descriptor, eliminating that descriptor or replacing it with two descriptors that do not include the address range in question. Thus, when the LEARN mode is complete, the derived memory map does not include a substantial number of aliased subblocks and is of minimal size.

In addition to providing the above-discussed functional tests and "LEARN" mode, the presently-preferred embodiments of the invention are configured and arranged to facilitate testing and troubleshooting routines which allow the test set operator to isolate a fault to the component level. Although the troubleshooting routines and tests implemented by the invention basically involve utilizing the microprocessor-based main frame assembly to generate conventional test stimuli (e.g., "walking ones", a ramp signal or a signal that includes selectively toggled data bits) for performing well-known test procedures such as event counting and signature analysis, the previously-discussed manner in which the invention operates permits the test systems of this invention to provide a probe that can be placed in contact with a selected circuit node of the UUT to inject system stimuli or detect system output signals in synchronism with operation of the UUT. More specifically, with respect to synchronous detection of UUT data signals, the probe arrangement of the present invention includes a circuit which detects whether the signal level at the monitored node is at a logical high level or at a logical low level. To synchronize the operation of the probe circuit to the operation of the UUT, a sync circuit included in the interface pod supplies a signal pulse each time the test arrangement is switched into the state in which the microprocessor circuit of the pod is in signal communication with the UUT. This sync signal activates latch circuits within the probe circuitry to thereby sample the signal appearing at the monitored node during that particular UUT clock period, with the output of the latch circuits being supplied to a pair of pulse stretchers that drive two indicators and to an invalid logic level detection circuit. In this arrangement, the pulse stretcher circuits cause the associated indicator to be energized for a predetermined period of time if the corresponding logic level is present when the signal at the monitored circuit node is sampled by the probe circuit latches. Since each pulse stretcher circuit maintains the associated indicator in the energized state if the logic signal reoccurs during the predetermined time period, one or both indicators will be continually energized if the corresponding logic level (or both) repeatedly appears at the monitored node. The invalid pulse logic level detection circuit disables both indicators for a perceptable amount of time whenever the signal at the monitored node is an invalid logic level for a period of time greater than the maximum allowable signal transition time (approximately 100 nanoseconds in the disclosed embodiment). Thus, one or both of the indicators will be alternately energized and deenergized whenever the signal at the monitored node indicates both valid and invalid logic levels and the probe indicators are thus capable of indicating all combinations of logic level high, logic level low and invalid logic level conditions at the monitored node.

With respect to use of the probe to inject test signals at a selected node of the UUT, the probe arrangement of the invention includes a pair of driver circuits for supplying signals at a logical high and logical low level. These pulse drivers are controlled by a J-K flip-flop and an output register that is programmed in accordance with a predetermined test format or by the test set operator via the main frame keyboard. In either case, when the probe is operated to supply logic pulses at a selected UUT node, the sync signal supplied by the interface pod triggers the driver circuits with the J-K flip-flop and the associated register determining whether a logical high signal pulse, a logical low signal pulse, or an alternating sequence of high and low signal pulses are provided.

To give the operator maximum flexibility in using the probe, the sync-generation circuitry in the interface pod can be controlled from the mainframe such that the circuit will select one of several difference sync signals in the interface pod. When the interface pod switches to communicate with the UUT, a sync signal is generated (and transmitted to the probe circuitry as described above). This sync signal can be selectively chosen to trigger the probe circuit during one of several different phases of the UUT clock. A selection (by the operator from the mainframe keyboard) is usually made between the address-valid portion of the UUT-clock phase and the data-valid portion of the clock. This selection will cause the probe measurement or stimulus to occur in synchronism with the address-valid or data-valid period of the UUT-clock (as selected by the operator). This sync signal selection capability in the interface pod can be used to provide generator-selected probe synchornization to a wide variety of interface-pod-created UUT events.

BRIEF DESCRIPTION OF THE DRAWINGS

Other objects and advantages of the present invention will become apparent to one skilled in the art after reading the following description, taken together with the accompanying drawing in which:

FIGS. 2A and 2B collectively provide a more detailed block diagram of an interface pod of the type illustrated in FIG. 1.

DETAILED DESCRIPTION

Figure 1:
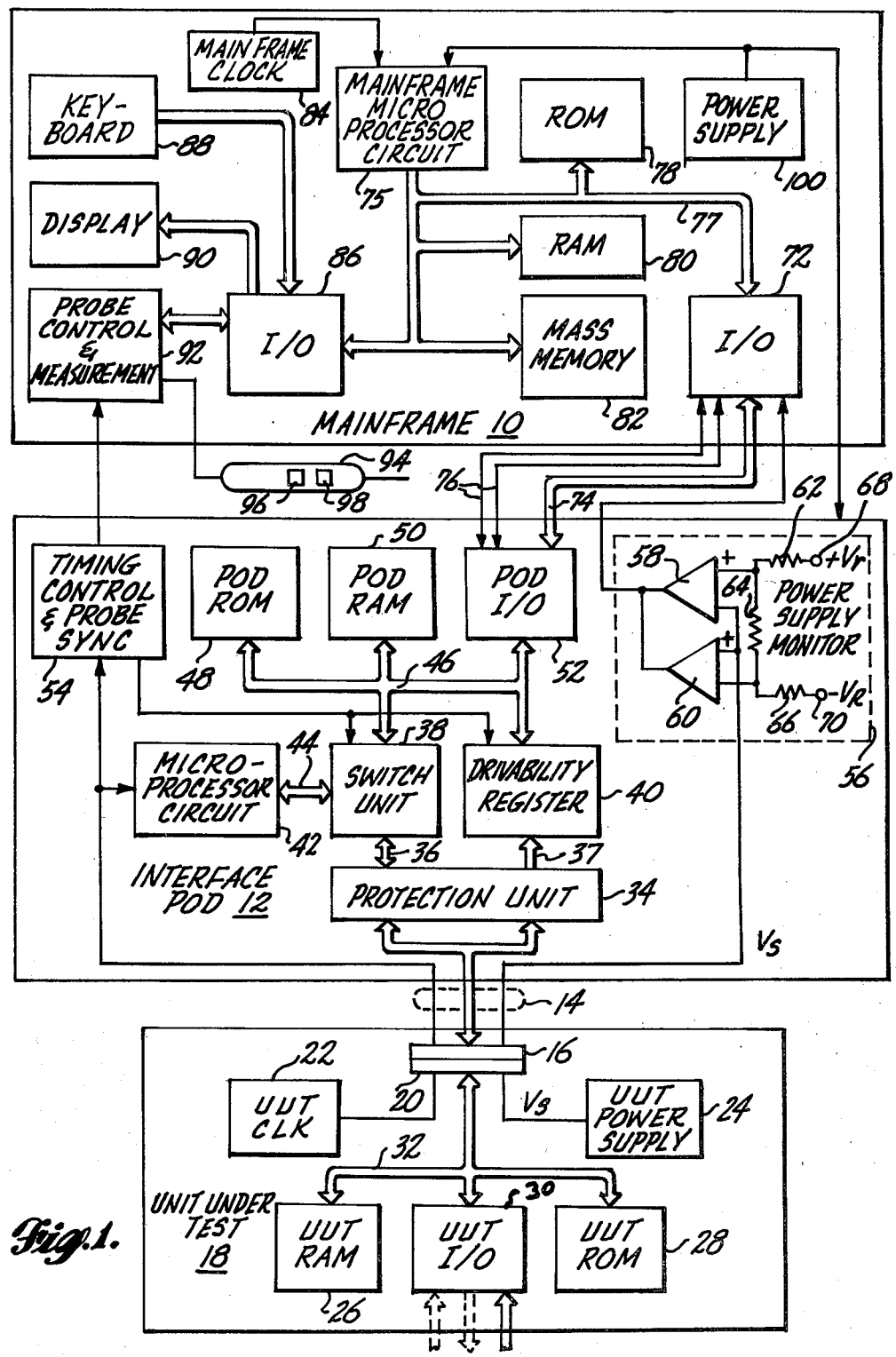
FIG. 1 is a block diagram of a test arrangement constructed in accordance with this invention, with the test arrangement connected to a microprocessor-based assembly or system under test.

With reference to FIG. 1, a test system constructed in accordance with this invention includes a main frame unit 10 that is electrically interconnected with (or contains) an interface pod 12. Interface pod 12 includes a cable assembly 14 having a connector 16 at the remote end thereof. As is indicated in FIG. 1, connector 16 couples the test arrangement of this invention to a unit under test (UUT) 18 by being inserted in a socket 20 that normally receives the UUT microprocessor circuit (not shown in FIG. 1.) In situations wherein the UUT microprocessor is not readily removable, the UUT can be provided with a temporary or permanent test socket and provisions can be made for disabling the UUT microprocessor circuit when the UUT is to be tested with the test arrangement of this invention. As shall be described in more detail in the following paragraphs, the depicted arrangement is structured and arranged for functionally testing the various microprocessor system components contained in UUT 18 and for performing various detailed troubleshooting routines that are often necessary to isolate a fault to a particular UUT component. As shall be understood upon reading the following description, a test arrangement arranged in accordance with the invention is, itself, a microprocessor-based system wherein interface pod 12 includes circuitry for adapting the test arrangement for use with the particular type of microprocessor that is employed in the circuit assembly being tested (e.g., UUT 18) and main frame 10 includes a microprocessor-based arrangement that constitutes the remaining portion of the test arrangement circuitry and controls and directs the activities of interface pod 12. For example, in one realization of the presently preferred embodiment of the invention main frame 10 is arranged to accommodate testing of a microprocessor-based system that employs: (a) up to 32-bit address and data signals; (b) as many as eight control lines (i.e., conductors that carry signals such as an "interrupt acknowledge" that indicates the microprocessor has received an interrupt request, a "ready" or "valid memory address" signal that indicates that the system bus is carrying valid address information; and various other signals that are generated by a microprocessor circuit to indicate the response of the microprocessor to an input signal or command; and (c) a maximum of sixteen status lines (i.e., conductors that carry signals to the microprocessor circuit to, for example, initiate an interrupt or temoprarily transfer control of the system bus to an external bus controller). Although currently available microprocessor circuits utilize fewer address, data, control and status bits, configuring main frame 10 in such a manner permits the test arrangement to be utilized in the testing of electronic systems and assemblies which employ any microprocessor circuit that is presently manufactured or contemplated by suitably configuring interface pod 12.

The UUT 18 depicted in FIG. 1 schematically indicates the wide variety of microprocessor-based systems that can be advantageously tested by the present invention. In this regard, as is illustrated in FIG. 1, such microprocessor-based assemblies and systems include a clock circuit 22 and a power supply 24 which are interconnected with the socket 20 to normally couple one or more clock signals and one or more supply potentials to the UUT microprocessor circuit. In accordance with this invention the clock signal supplied by UUT clock 22 is coupled to interface pod 12 via connector 16 and cable assembly 14 and, as shall be described hereinafter, is utilized for timing and control of the test assembly as well as UUT 18. Similarly, the circuit potential or potentials supplied by UUT power supply 24 are coupled to interface pod 12 and are continuously monitored throughout each test sequence that is performed with the test arrangement of this invention. As is further illustrated in FIG. 1, typical microprocessor units that are tested with this invention (e.g., UUT 18) include at least one random access memory circuit (RAM) 26, at least one read only memory circuit (ROM) 28, and at least one input/output circuit (I/O) 30 which are interconnected with one another (and under normal circumstances, with the UUT microprocessor circuit) via a UUT bus structure 32. As is understood by those skilled in the art, the depicted UUT bus 32 typically includes a plurality of address lines, and a plurality of the above-mentioned data and status lines which normally couple signals between the UUT microprocessor circuit and the UUT RAM 26, ROM 28 and I/O unit 30 to thereby cause the UUT to execute a series of operations in accordance with instructions stored in UUT ROM 28 and/or supplied to the UUT via the UUT I/O unit 30. As previously mentioned, when a microprocessor-based system or assembly is tested with the present invention, the test assembly is connected in place of the UUT microprocessor circuit and is thus directly connected to the UUT bus 30 and the conductors that furnish the UUT clock signal and power supply signals. Installed in this manner, a test arrangement of this invention executes test sequences which do not depend on or necessarily incorporate the operating sequence that is normally executed by UUT 18. As shall be understood more fully upon reading the following description, this permits the invention to verify the functional integrity of UUT bus 32 and each component that is connected thereto (e.g., RAM 26, ROM 28 and I/O unit 30) without utilizing any memory space within UUT 18 and without having any detailed documentation on the structure and programming of UUT 18. As shall be described in detail hereinafter, the presently preferred embodiments of the invention also provide a mode of operation wherein the test arrangement functionally replaces the microprocessor circuit of UUT 18 thereby allowing UUT 18 to execute its normal operational sequence and permitting the test set operator to perform any troubleshooting sequences and routines that are included in the operational programs of the UUT.

Referring now to the arrangement of interface pod 12, the address, data, control and status signals appearing on UUT bus 32 are coupled to a protection unit 34, which provides the degree of voltage and current limiting necessary to protect the test system circuitry if the test set operator improperly connects the test arrangement to a UUT 18 or if a malfunction within a unit being tested causes otherwise destructive signals to be coupled to interface pod 12. In addition, the circuitry within protection unit 34 preferably simulates the source and load impedance of a properly functioning microprocessor circuit relative to all signals that are coupled into and received from UUT 18 via interface pod 12, i.e., address signals, data signals and status signals. As is symbolically indicated by the double arrows 36 and 37 of FIG. 1, each data, address, status and control signal directed to, or supplied by, UUT 18 is coupled through an appropriate circuit within protection unit 34 and applied to a switch unit 38 and to a drivability register 40. The data, address, control and status leads of a microprocessor circuit 42, which is of a type identical to that normally utilized by UUT 18, are interconnected to a second input port of switch unit 38 via a signal bus 44. Additionally, the output port of switch unit 38 is connected to a signal bus 46 (hereinafter referred to as the pod bus), which includes conductors for coupling data and address signals between switch unit 38 and a pod ROM 48, pod RAM 50, pod I/O unit 52 and drivability register 40, which are all connected to pod bus 46.

Switch unit 38 of this invention is configured and arranged to: (a) cause microprocessor circuit 42 to operate in a first state (hereinafter referred to as the pod processor state) wherein switch 38 couples the data, address, control and status lines of microprocessor 42 to pod bus 46 so that microprocessor circuit 42, pod ROM 48, and pod RAM 50 define a complete microprocessor-based digital system that communicates with the circuitry of main frame 10 via pod I/O 52; and (b) cause microprocessor circuit 42 to operate in a second state (hereinafter referred to as the UUT test state) wherein switch 38 couples the data, address, control and status lines of microprocessor circuit 42, protection unit 34, and the UUT 18.

As shall be described in more detail hereinafter, during the various test sequences that are performed in accordance with this invention, switch 38 is activated to sequentially switch microprocessor circuit 42 between the pod processor state and the UUT test state. Basically, this alternating sequence is utilized so that microprocessor circuit 42: (a) first operates in the pod processor state (i.e., in conjunction with pod ROM 48 and pod RAM 50) to determine the next test instruction to be carried out and the associated UUT stimulus (e.g., an instruction to write a specific word of data at a particular address of UUT RAM 26); (b) switches to the UUT test state to couple the test stimulus to UUT 18 (e.g., write the desired data word at the specified address of UUT RAM 26) and to latch signals into drivability register 40 that are representative of the logic levels on UUT bus 32 at the conclusion of the UUT test state; and (c) switches back to the pod processor state for the analysis of the data stored in drivability register 40 and the formation of the next test instruction and stimulus and/or transmission of a signal to main frame 10 (via pod I/O unit 52) which indicates the result of the test step that was just completed.

In the arrangement of FIG. 1, the above-discussed alternating sequence between operation in the pod processor and the UUT test states is effected by means of a timing control and probe sync unit 54 which supplies a control signal that causes switch unit 38 to place microprocessor circuit 42 in the UUT test state for a predetermined period of time. Additionally, timing control and probe sync unit 54 supplies control signals to drivability register 40 for enabling storage registers contained therein so that signals representative of the signals on UUT bus 32 will be stored when microprocessor 42 is in the UUT test state and so that data can be read by microprocessor 42 when the test system is returned to the pod processor state. As is indicated in FIG. 1, the signal supplied by UUT clock 22 is coupled to both microprocessor circuit 42 and to timing control and probe sync unit 54 to provide the clock signal utilized when the system operates in the pod processor state and to provide a signal which causes timing control and probe sync unit 54 to operate in conjunction with switch unit 38 so as to switch microprocessor 42 into the UUT test state both at the proper time and for a period equal to that required for the UUT to execute a single step of an operational sequence (i.e., for the period of time that is often referred to as one "bus cycle", which is generally equal to one or more periods of the UUT clock or, in some arrangements, that employ a multiphase clock, is equal to a logical combination of two clock signals). To effect such operation, the hereinafter-discussed timing control and probe sync circuitry of the presently preferred embodiments of the invention basically comprise an interval timer that is loaded with an appropriate timing value (stored in pod ROM 48) each time the system begins operation in the pod processor state to establish new test stimuli after it has completed analysis of data obtained in the previous step of the test sequence (when microprocessor circuit 42 was operated in the UUT test state). In this arrangement, the timing value loaded into the interval timer from pod ROM 48 is representative of the number of UUT clock pulses that are required to accomplish the steps necessary to establish the particular stimulus to be used when the system switches to the UUT test states and the interval timer is a counter circuit which is interconnected so as to be clocked by the UUT clock signal and count downwardly from each timing value that is loaded into the counter. When the counter reaches a terminal count of zero, the "borrow signal" activates switch unit 38 to place microprocessor circuit 42 in the UUT test state for a period of time substantially equal to one bus cycle.

In addition to providing for the above-discussed sequential alternating operation of microprocessor 42 in the pod processor state and the UUT test state, switch unit 38 includes means for selectively preventing various control signals that could be generated by UUT 18 from reaching microprocessor 42 while it is operating in the pod processor state. For example, if signals such as an interrupt request (typically denoted as a INT signal) or a signal requesting microprocessor 42 to transfer control of the bus to an external controller (often denoted as a HALT signal) are permitted to reach microprocessor 42 while the test system is operating in the pod processor state, the test sequence would not only be interrupted, but unless suitable provisions are made in the operation of timing control and probe sync 54, the test arrangement would not complete the sequence of steps being executed within the allotted number of clock periods (i.e., within the period of time associated with the above-mentioned timing value that is obtained from pod ROM 48). If this should occur, the test arrangement would lose control of the UUT and, under most circumstances, would cause the test sequence to stop. As will be recognized by those skilled in the art and as is described in more detail relative to FIG. 2, various arrangements can be utilized within switch 38 to selectively disable the UUT control signals to the microprocessor, including tri-state buffer circuits and conventional AND gates.

In addition to operating in the above-described manner wherein microprocessor 42 is sequentially switched between the pod processor state and the UUT test state, the presently-preferred embodiments of the invention are configured and arranged for operation wherein microprocessor 42 in effect is maintained in the UUT test state and all UUT control and status signals are coupled to the microprocessor circuit. This mode of operation, herein referred to as the UUT RUN mode enables a realization of this invention to operate as a conventional in-circuit emulator and perform any test routines that may be included in the UUT memory circuits.

With continued reference to FIG. 1, interface pod 12 also includes a power supply monitor 56 which is responsive to the UUT power supply signal that is supplied via test cable 14 and provides a failure signal to main frame 10 if the UUT power supply signal or signals are not within an acceptable voltage range. For example, in the arrangement depicted in FIG. 1, UUT 18 supplies a single positive supply voltage, $V_s$ which is coupled to the inverting input terminal of a comparator circuit 58 and the noninverting input terminal of a comparator circuit 60, with the output terminals of comparators 58 and 60 being interconnected with one another and coupled to circuitry within main frame 10. In this arrangement, three resistors 62, 64, and 66 are connected in series between a terminal 68 and a terminal 70 with the junction between resistor 62 and 64 being connected to the noninverting input terminal of comparator 58 and the junction between resistors 64 and 66 being connected to the inverting input terminal of comparator 60.

In operation, when the UUT power supply voltage $V_s$ is between the DC potential at the junction of resistors 62 and 64 and the DC potential developed at the junction of resistors 64 and 66, comparators 58 and 60 supply a positive potential (e.g., a logic level high signal) to indicate that UUT power supply 24 is operating normally. On the other hand, if the signal level supplied by UUT power supply 24 is greater than the potential at the junction of resistors 62 and 64 or is less than the potential at the junction of resistors 64 and 66, the signal supplied at the commonly-connected output terminals of comparators 58 and 60 decreases to a logic level low to thereby provide a power supply failure signal to main frame 10. In the presently-utilized realizations of the invention, a power supply failure signal is recognized by the microprocessor contained in main frame 10 and initiates a "UUT POWER FAILURE" message.

As is shown in the block diagram arrangement of FIG. 1, main frame unit 10 includes an I/O unit 72 which receives the above-mentioned UUT power failure signal and, as is indicated by the double arrow 74 of FIG. 1, carries the parallel format digitally-encoded signals that flow between main frame 10 and interface pod 12. As was previously mentioned and as shall become readily apparent upon understanding the hereinafter-discussed test sequences, the data transmitted from main frame 10 to interface pod 12 is usually a digitally encoded command signal that causes interface pod 12 to initiate a particular sequence that involves one or more operations in the UUT test state and the digitally encoded signals transmitted from interface pod 12 to main frame 10 indicate the results of each such test sequence. To facilitate this bidirectional signal transfer between main frame 10 and interface pod 12, a pair of control lines 76 extends between pod I/O unit 52 and the I/O circuit 72 of main frame 10. Control lines 76 carry "handshake" signals which indicate the state of main frame 10 and interface pod 12 with respect to the coupling of data signals between I/O circuit 72 and pod I/O 52. For example, in present realizations of the invention, when a command signal is coupled from main frame 10 to interface pod 12, one of the control lines 76 will be switched from a logical high to a logical low state at the time the command signal is transmitted by main frame 10 and the second control line 76 is switched to a logical low level when the transmitted signal is received by interface pod 12. This transition in the second control line is detected within main frame 10 and acknowledged by switching the first control line back to the logical high state. The return of the first control line to the logical high state is detected in interface pod 12 and the second control line is returned to the logical high state to return the system to its original condition. The handshake operation associated with the transfer of data from interface pod 12 to main frame 10 of the presently preferred embodiments of the invention is similar, with main frame 10 operating to place the first control line at a logical low level whenever the main frame is ready to receive signal data (e.g., "waiting" for a test result). The second control line 76 is switched to a logical low level by microprocessor circuit 42 when data is transmitted by interface pod 12 and hereinafter described circuitry within main frame 10 causes the first control line 76 to be switched back to a logical high state when the transmitted data is received. The change in state in the first control line 76 is sensed by microprocessor 42, which periodically polls pod I/O unit 52, and interface pod 12 causes the second control line 76 to revert to the logical high state thereby returning both control lines 76 to a quiescent state until subsequent data is to be transmitted to or from main frame 10.

In view of the block diagram arrangement of main frame 10 that is depicted in FIG. 1 and the above-described manner in which data is transmitted between main frame 10 and interface pod 12, those skilled in the art will recognize that main frame 10 is, itself, a microprocessor-based system which can be programmed to execute a wide variety of operational sequences. In this regard, I/O circuit 72 is coupled to a microprocessor circuit 75 via a signal bus 77. A read-only memory (ROM) 78, a random-access memory (RAM) 80 and a mass memory unit 82 are connected to signal bus 77 to provide the storage capabilities required for execution of the desired test sequences. In this arrangement, ROM 78 stores the instructions and data necessary for performing various predetermined test sequences; RAM 80 provides for temporary storage of various data that is generated and utilized during a particular test sequence; and mass memory 82 allows the arrangement of FIG. 1 to execute relatively complex and specialized test sequences that are programmed by the test system operator or are read into mass memory 82 from conventional storage media such as magnetic tape or disc.

With continued reference to FIG. 1, the microprocessor-based arrangement of main frame 10 is clocked by a main frame clock circuit 84 and includes a second I/O unit 86 which provides an interface with a keyboard 88, a display unit 90 and a probe control and measurement unit 92. Keyboard 88 and display unit 90 are conventional devices of a type well known to those skilled in the art with keyboard 88 being utilized by the test system operator to initiate the various test sequences, to supply any operator-specified information necessry during such a test sequence (e.g., the initial and UUT final address for a test) and to load specialized programs or instructions into mass memory 82. In the presently-preferred embodiments of the invention, display unit 90 is a 32-character alphanumeric display unit which not only presents the test results, but through operation of the microprocessor-based system of main frame 10 provides a display requesting (i.e., "prompting") the test set operator to supply any data that is necessary during a test sequence.

Figure 3:
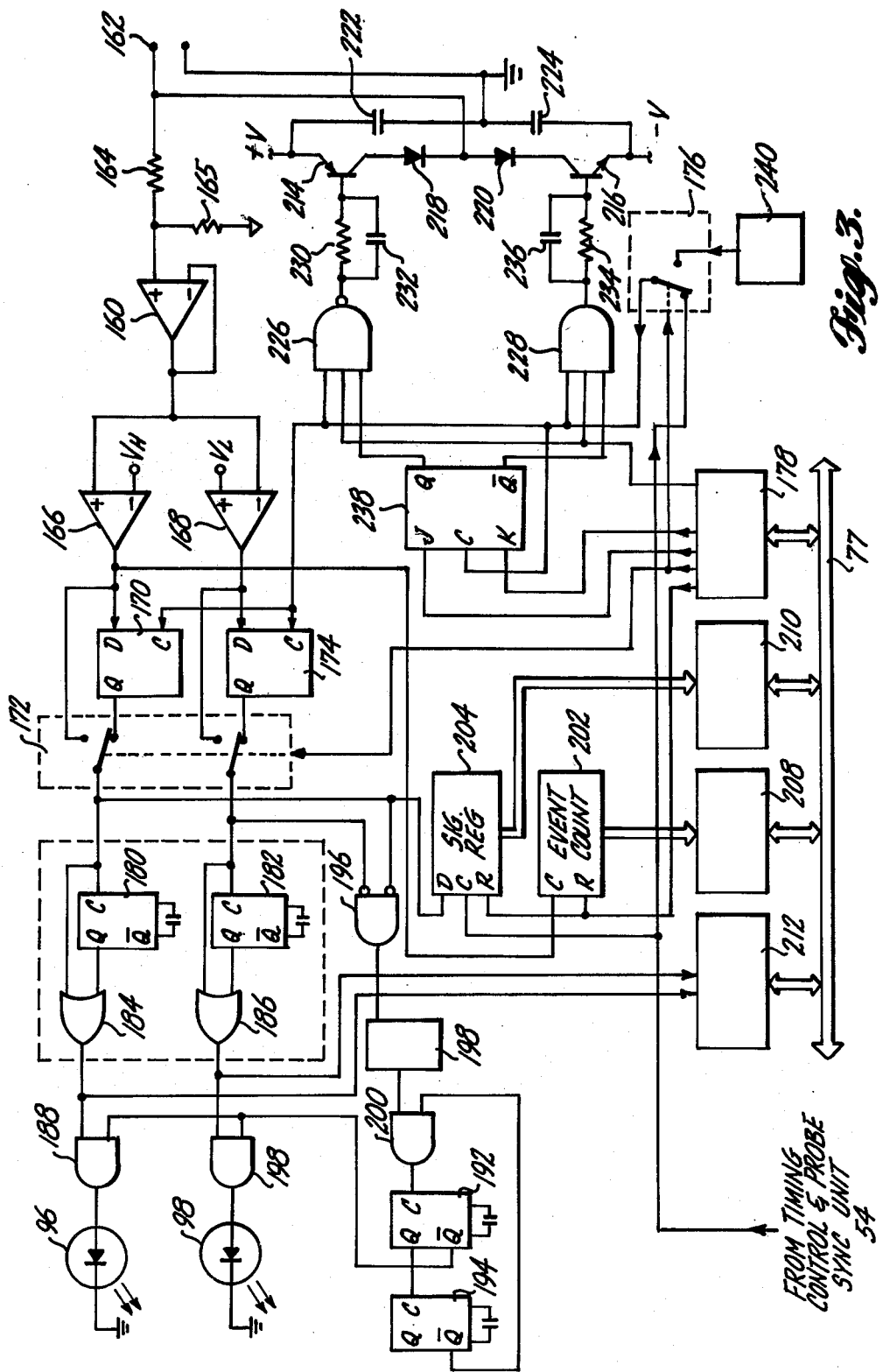
FIG. 3 is a schematic diagram of the single point probe circuit that forms a part of the present invention.
Figure 1:
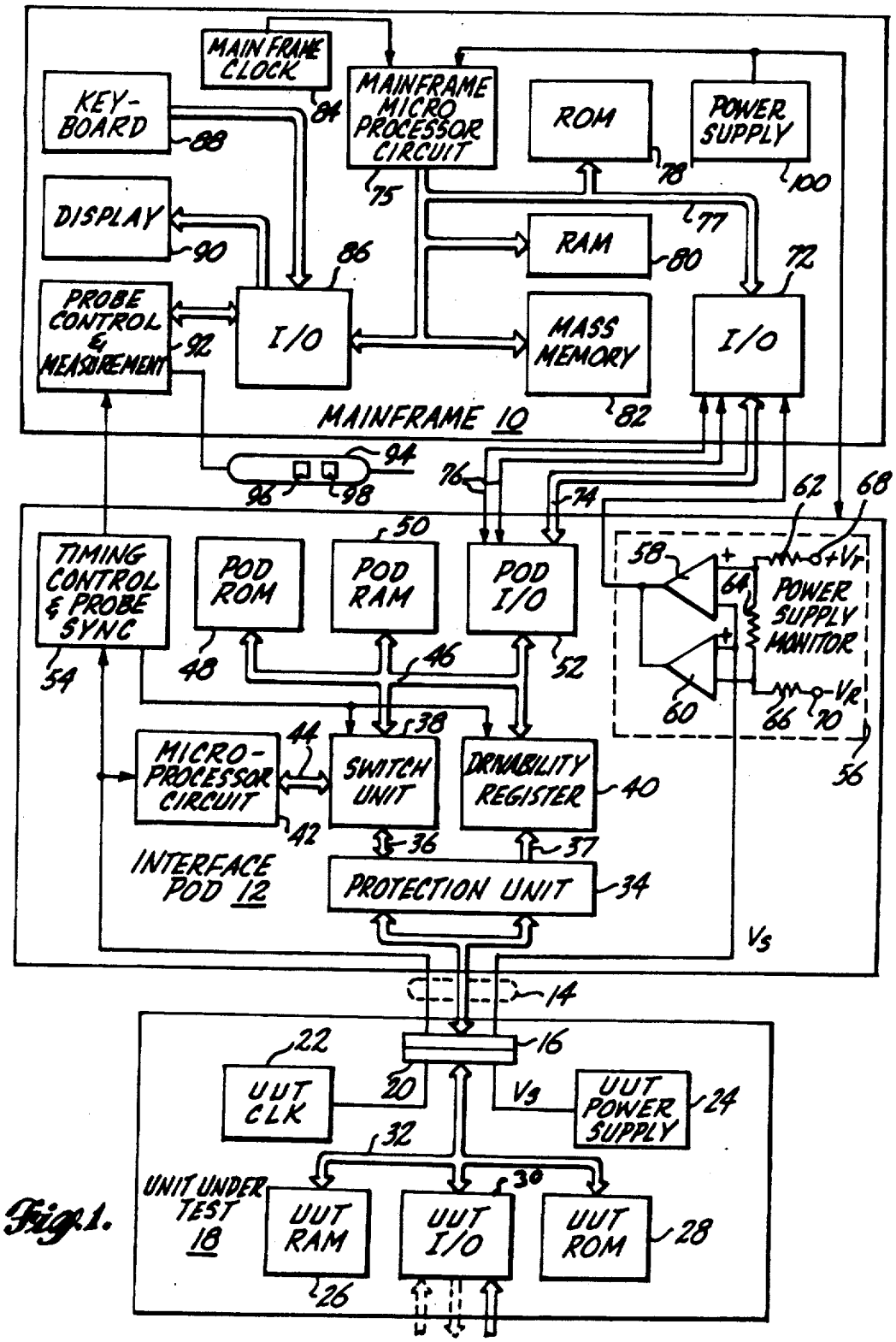

Probe control and measurement unit 92 is electrically connected to a probe unit 94, which is utilized both as a means of injecting and measuring logic signals at a selected circuit node of UUT 18 when detailed troubleshooting or fault isolation procedures are being implemented with this invention (i.e., after performing the various hereinafter test sequences which generally localize a fault or failure to a particular portion of the UUT circuitry). As shall be discussed relative to the various test sequences that are typically employed with the invention and with respect to the realization of a probe control and measurement and that is illustrated in FIG. 3, complete troubleshooting routines that utilize probe 94 can be stored in the read-only memory circuits of main frame 10 and interface pod 12 (pod ROM 48 and main frame ROM 98) or such programs can be loaded into mass memory 82 from keyboard 88 or conventional data storage apparatus employing tape or other storage media. Additionally, the presently-preferred embodiments of the invention permit probe unit 94 to be used, in effect, as a separate test instrument (i.e., without the execution of a supporting test sequence that is designed for the particular type of UUT being tested). When utilized in such a manner, probe 94 can be used to perform various well-known troubleshooting techniques ranging from simple logic level sensing to transition counting and the type of cyclic redundancy check that is commonly referred to as "signature analysis" when used in conjunction with the pod stimulus capability.

To facilitate use of probe unit 94 in each of the above-noted manners, probe control and measurement unit 92 is responsive to a probe sync signal supplied by timing control and probe sync unit 54 of interface pod 12. In particular, timing control and probe sync unit 54 supplies a signal pulse to probe control and measurement unit 92 each time microprocessor circuit 42 of interface pod 12 is switched to the previously discussed UUT test state. When probe 94 is being operated to sense the logic level at selected circuit node of UUT 18, the sync signal supplied to the probe control and measurement unit 92 is utilized to enable storage registers which, in effect, sample the signal level at the circuit node of interest. On the other hand, when probe 94 is utilized to inject a particular signal at the selected node (i.e., a logic level high, a logic level low, or an alternating sequence off high and low signals), probe control and measurement unit 92 utilizes the sync pulses provided by timing control and probe sync unit 54 of interface pod 12 to inject a single test signal into the selected node of UUT 18 in synchronism with each bus cycle while microprocessor circuit 42 is in the UUT test state. This synchronization of probe 94 not only facilitates troubleshooting through signature analysis, but as shall also be described relative to the more detailed probe control and measurement unit depicted in FIG. 3, can be utilized to activate two indicators 96 and 98 of probe 94 so as to provide an indication of a variety of various logic states at the circuit being monitored. For example, the presently-preferred embodiments of the invention not only provide a visual indication that the signal at the monitored circuit node is at a logical high level, a logical low level, or an invalid logic level, but also provide an indication that all three logic levels are present at various times within the time period that probe 94 is in contact with the selected node and timing control and probe sync unit 54 continues to supply sync pulses. Moreover, these arrangements indicate the presence of any two of the possible conditions (invalid signal, logic level high, and logic level low) during a time interval in which the probe is placed in contact with a selected circuit node of UUT 18 and timing control and probe sync unit 54 of interface pod 12 supplies sync signals to probe control and measurement unit 92 of main frame 10.

As is additionally indicated in FIG. 1, main frame 10 also includes a power supply unit 100 which supplies the necessary operating potentials for the circuitry of main frame 10. Further, in the presently-preferred embodiments of the invention, power supply 100 supplies the necessary operating potentials to interface pod 12.

Figure 2B:
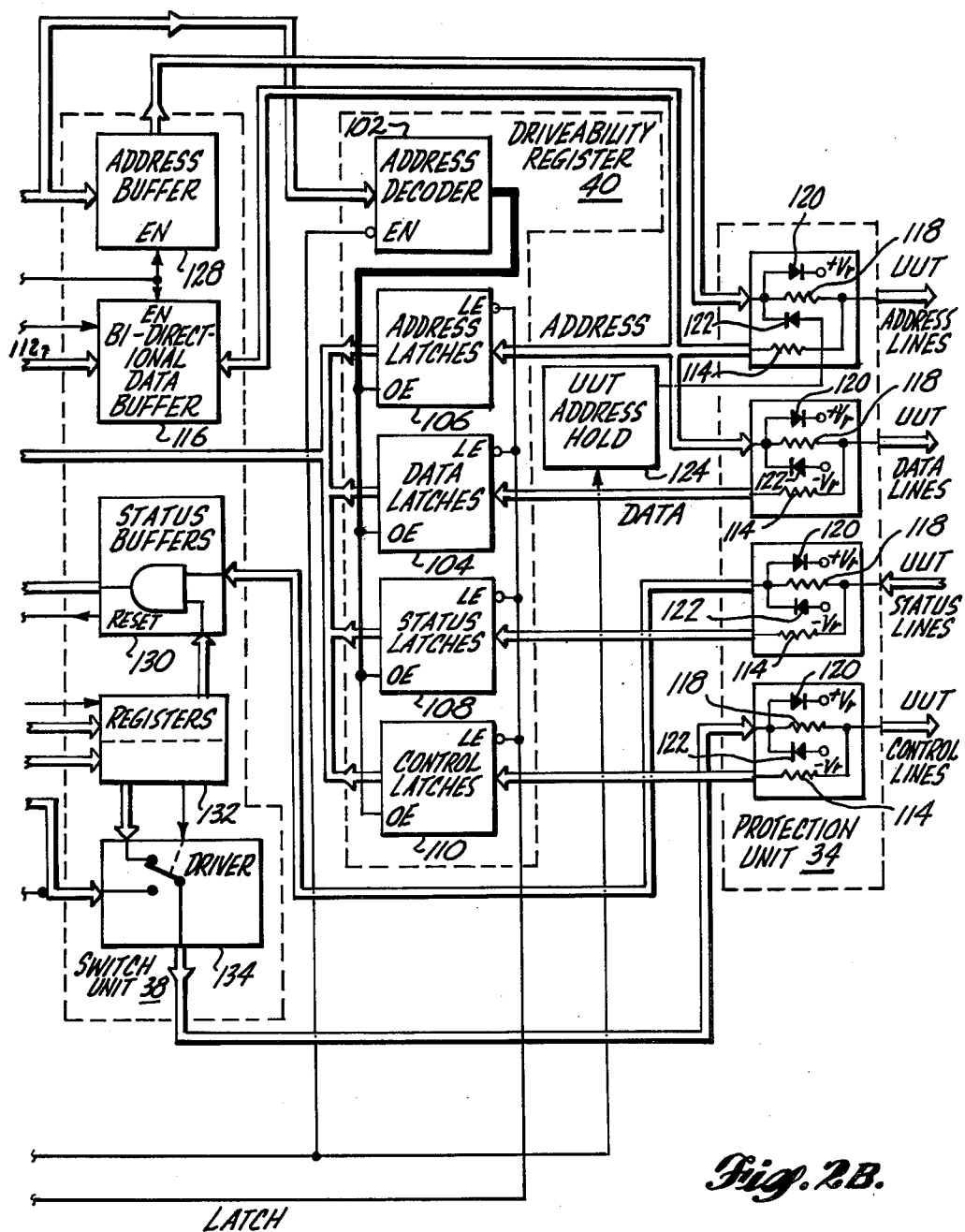

FIGS. 2A and 2B provide a more detailed depiction of the manner in which a pod interface unit 12 is implemented in the presently-preferred embodiments of the invention to accommodate testing of a microprocessor-based assembly or system (e.g., UUT 18 of FIG. 1) which utilizes a 16-bit address signal, an 8-bit data signal and a dynamic RAM that must be refreshed at a predetermined rate in order to maintain storage of volatile data. As is indicated in FIG. 2B, drivability register 40 of the depicted interface pod 12 includes an address decoder 102 which is disabled by a UUT ON signal that is provided by timing control and probe sync unit 54 whenever the test system is not in the UUT test state (i.e., when the test system is in the pod processor state). In this arrangement, the address signal provided by microprocessor 42 is coupled to address decoder 102, which includes a conventional combinatorial logic circuit that can be realized as an integrated circuit or as an array of conventional gate circuits and is arranged for selectively coupling a signal to the output enable terminal (OE in FIG. 2B) of a set of data latches 104, a set of address latches 106, a set of status line latches 108, and a set of control latches 110. Since the output ports of the data latches 104, 106, 108, and 110 are commonly connected to a data bus 112, which forms a portion of pod bus 46 of FIG. 1, it can be recognized that address decoder 102 permits the signal information stored in each of the latch circuits to be selected and read by microprocessor 42 during a portion of a test sequence wherein the test system operates in the pod processor state. For example, if the test system writes data into a specified address of UUT RAM 26 during a first test step (while the system is in the UUT state), test instructions that are stored in pod ROM 48 can be utilized when the system reverts to the pod processor state to cause microprocessor circuit 42 to generate address signals that cause address decoder 102 to sequentially enable the output circuits of address latches 106 and data latches 104 so that microprocessor circuit 42 can verify that the proper address signal and proper data signal have been transmitted to UUT 18.

As is indicated in FIG. 2B, each data, address, status and control line that extends between interface pod 12 and UUT 18 is coupled to the input port of a latch circuit within data latches 104, address latches 106, status line latches 108, and control latches 110 via a resistor 114 that is contained in protection unit 34 and prevents damage to the latch circuits in the event that a failure within UUT 18 or an inadvertent error in interconnecting interface pod 12 to UUT 18 causes a relatively high potential to appear on any of the signal lines that are connected to the latch circuits of drivability register 40. As is also indicated in FIG. 2, latches 104, 106, 108, and 110 are enabled for receiving data by a LATCH signal that is provided by timing control and probe sync 54. As shall be described in more detail hereinafter, the LATCH signal causes the data, address, status and control signals that are coupled to or received from UUT bus 32 of FIG. 1 to be stored in the respective latch unit (104, 106, 108 and 110) at the conclusion of each test step in which the test system operates in the UUT test state.

As is shown in FIG. 2B, the data leads that extend between interface pod 12 and UUT 18 are coupled to the output port of a bidirectional buffer unit 116 that is included within the switch unit 38 of the interface pod 12 being described. Although not fully illustrated in FIG. 2, each data line is coupled to an individual circuit such as a tristate buffer stage via a current-limiting resistor 118 that is located in protection unit 34. Additionally, the junction between a pair of like-poled, serially connected diodes 120 and 122 is connected to the terminal of resistor 118 that supplies a signal to a bidirectional buffer 116. Since the cathode electrode of diode 120 is connected to a potential that is lower than the system logical high level by approximately one diode drop (approximately 0.7 volts) and the anode electrode of diode 122 is connected to a potential that is approximately one diode drop above the system logical low potential, the voltage at the input to each circuit stage of bidirectional buffer unit 116 will be limited to potentials between logic level high and logic level low.

Regardless of the configuration of protection unit 34, the individual stages of bidirectional buffer unit 116 are activated to couple the signals appearing on data bus 112 to UUT 18 when the test system is operating in the UUT test state and to isolate UUT 18 from the signals appearing on data bus 112 when the test system is operating in the pod processor state. In this regard, the UUT ON signal supplied by timing control and probe sync unit 54 is coupled to an enable terminal (EN) of bidirectional data buffer unit 116 and the read/write signal supplied by microprocessor 42 (R/$\overline{\text{W}}$ in FIG. 2A) is supplied to bidirectional data buffer unit 116 to control the direction of data transfer.

As is illustrated in FIG. 2B, protection unit 34 also includes a current-limiting resistor 118 and a pair of diodes 120 and 122 which are connected to each status and control line in the previously discussed manner. Additionally, each address line that extends between interface pod 12 and a UUT 18 is connected to a circuit within protection unit 34 that includes a resistor 118 and a diode 120 and a diode 122 which, except for the anode element of diode 122, is connected in the above-described manner. In particular, the anode of each diode 122 that is associated with an address line is coupled to a UUT address hold unit 124, which selectively connects the anode element of each associated diode 122 to a potential that is approximately one diode drop below the system logic low level or to a potential that will cause the associated address line (and hence all address lines) to be clamped at logical high level. In this regard, UUT address hold unit 124 is responsive to the UUT ON signal that is provided by timing control and probe sync unit 54 when the test system is in the pod processor state to clamp the address lines at a logical high state (thereby providing a hexadecimal address signal of FFFF to UUT 18. This action provides a default address to the UUT bus whenever the test system is in the pod processor state which, in combination with read/write control signals, are coupled to UUT 18 via buffer unit 116, generates during read cycles for refreshing any dynamic memory included in UUT 18. Moreover, providing such an address during portions of the test sequence in which the system is in the pod processor state not only aids in refreshing dynamic memory within UUT 18, but is also advantageous in that it normally prevents any other activity within UUT 18 during that period and thus holds UUT 18 in a stable state until microprocessor circuit 42 supplies a test stimulus during the nextmost step in which the test arrangement operates in the UUT test mode.

It should be noted that the address utilized in the above-discussed technique of ensuring that all dynamic RAM units within UUT 18 are refreshed can, in most cases, be any valid address of UUT memory space. However, to ensure that an appropriate address is generated, the reset address of the associated microprocessor is generally employed. As is known to those skilled in the art, that address depends on the type of microprocessor circuit employed in UUT 18 and is generally the address corresponding to all address bits low (e.g., the hexadecimal signal 0000) or is the address that corresponds with all address bits high (hexadecimal address FFFF). As will be recognized by those skilled in the art, UUT address hold unit 124 can provide a default address of 0000 by driving the cathode electrodes of diodes 120 low with the anode electrodes of diodes 124 being connected to a potential of approximately 0.7 volts.

With continued reference to FIG. 2B, the above-discussed address lines receive address signals from microprocessor circuit 42 via a portion of pod bus 46 that is identified as address bus 126 in FIG. 2B. In this regard, each conductor of address bus 126 is connected to the input port of a buffer stage that is contained in an address buffer unit 128. As is indicated in FIG. 2B, the buffer stages of address buffer unit 128 are enabled by the UUT ON signal and the output terminals of the buffer stages are connected to the individual address lines of UUT 18 via one of the above-discussed protection circuits of protection unit 34. Thus, whenever the test system operates in the UUT test state, address buffer unit 128 is enabled to permit microprocessor circuit 42 to supply address signals to UUT 18. On the other hand, when the test arrangement is in the pod processor state, address buffer unit 128 is disabled and isolates address bus 126 of interface pod 12 from UUT bus 32.

Each status signal provided by UUT 18 when the test arrangement is in the UUT test state or is operated in the UUT RUN mode is coupled from protective unit 34 to a status buffer unit which includes a plurality of buffer stages that can be selectively and individually enabled or disabled in accordance with the logic states of a binary signal that is supplied by a register unit 132. In this arrangement, register unit 132 can be a portion of pod I/O unit 52 or can be an array of separate register circuits which are controlled through operation of main frame keyboard 88 (via pod I/O unit 52) to thereby permit the test system operator to select those status signals that will be coupled to microprocessor 42 during a particular test sequence. For example, the certain other types of microprocessor circuits include a WAIT line which causes the microprocessor to decrease the rate at which bus transactions are effected in order to allow relatively slow I/O devices to be used in the microprocessor-based system being tested (e.g., UUT 18 of FIG. 1). When the WAIT line is used in this manner to facilitate operation with relatively slow I/O units, it is generally desirable to activate register 132 and the associated buffer circuit in status buffer unit 130 so as to couple the WAIT signals from UUT 18 to microprocessor circuit 42.

With continued reference to FIG. 2B, register units 132 also supply signals to a driver unit 134 which can be any conventional device such as a data selector that, in effect, functions as a switch which selectively supplies control signals to the UUT bus from microprocessor circuit 42 or from register 132. The independent control over the UUT control lines that is provided by registers 132 and driver 134 is used, for example, in the hereinafter-described tests that are conducted to determined the functional state of control lines within UUT bus 32.

The arrangement of FIG. 2A also includes a timing control unit 140 which corresponds to the portion of timing control and probe sync unit 54 (FIG. 1) that switches the test system between the pod processor and UUT test states, with the depicted arrangement being configured so that the interface pod of FIG. 2 adapts the test system for operation with microprocessor-based systems and assemblies employing an MC-6800 microprocessor circuit, manufactured by Motorola Semiconductor Products, Inc. of Phoenix, Ariz. In the arrangement shown in FIG. 2A, timing control unit 140 includes an interval timer 142 having the output terminal thereof connected to the reset terminal of a type-D flip-flop 144 and to the reset terminal of a J-K flip-flop 146. The input terminal of interval timer 142 connected for receiving phase 2 ($\phi_2$) of the two-phase clock signal that is required by the MC-6800 device. As is indicated in FIG. 2A, interval timer 142 can be addressed by microprocessor circuit 42 and loaded with a parallel format digitally-encoded signal which causes the output terminal thereof to go high and remain high until a number of UUT $\phi_2$ clock periods that is equal to the value loaded into the timer have elapsed. Interval timers of this type are well-known in the art, with the presently-preferred embodiments of the invention utilizing a timer that is included in an integrated circuit, which also includes circuitry for realizing pod RAM 50 and pod I/O unit 52 of FIGS. 1 and 2 and which is marketed by Motorola Semiconductor Products, Inc. under the product identifier MC 6532.

Continuing with the description of timing control 140, the UUT $\phi_2$ clock signal is coupled to the clock input of J-K flip-flop 146 and to one input terminal of a NAND gate 148 that supplies a LATCH signal for activating the data, address, status and control latches (104, 106, 108 and 110 of the depicted interface pod, during the final portion of each period of time in which the test system operates in the UUT test state). The second input terminal of NAND gate 148 is connected to the Q output terminal of J-K flip-flop 146, which provides a UUT ON signal to the enable terminals of address buffer 128 and bidirectional data buffer 116 and to the clock terminal of flip-flop 144 to switch the test arrangement into the UUT test state. The $\overline{Q}$ output terminal of J-K flip-flop 146 provides a $\overline{\text{UUT ON}}$ signal to switch the test system to the pod processor state, with the $\overline{\text{UUT ON}}$ signal being coupled to an enable terminal (EN) of address decoder 102, UUT address hold unit 124, and to one input terminal of a two-input NOR gate 150, which supplies a signal to the set terminal (S) of J-K flip-flop 146. To complete the depicted timing control unit 140, the second input terminal of NOR gate 150 is connected for receiving a $\overline{\text{RUN UUT}}$ signal that is supplied by pod I/O unit 52 and both the J and K input terminals of J-K flip-flop 146 are connected for receiving a signal supplied by an AND gate 152, which has the first input terminal thereof connected to the $\overline{Q}$ output terminal of flip-flop 144 and the second input terminal thereof connected for receiving a valid memory address (VMA) control signal that is supplied by microprocessor circuit 42.

In operation, each test sequence begins with the test system in the pod processor state (i.e., the $\overline{\text{UUT ON}}$ signal high) and the signal provided by interval timer 142 at a logical low level. When a command signal that is supplied to the interface pod of FIG. 2 by main frame 10 (via pod I/O unit 52) is decoded, a digitally-encoded signal that represents the number of $\phi_2$ clock periods required to prepare the interface pod for operation in the nextmost UUT test state is fetched from ROM 48 and loaded into interval timer 142. This causes the output signal provided by interval timer 142 to go high, which resets flip-flop 144. Each subsequent UUT $\phi_2$ clock pulse results in the execution of one step of the housekeeping operations (e.g., stack operations) or the operations necessary to formulate the UUT address (and, with respect to a WRITE operation, the data) that is necessary for the nextmost UUT test (i.e., the stimulus to be applied to UUT 18 during the nextmost period of time in which the test system is in the UUT test state). When the stimulus is formulated, interval timer 142 reaches a terminal count causing the signal applied to the reset terminals of flip-flops 144 and 146 to go low. Since the $\overline{Q}$ output terminal of flip-flop 144 is high, the next UUT $\phi_2$ clock pulse toggles J-K flip-flop 146 to cause the UUT ON signal to go high as long as the valid memory address signal (VMA) supplied by microprocessor 42 is high. In this regard, the VMA signal will be high unless, for example, a "halt" or Tri-state (TSC) signal is being supplied to microprocessor 42 to, for example, extend the bus cycle to permit execution of a direct memory access activity on the UUT bus. In such a case, J-K flip-flop 146 will toggle in synchronism with the positive-going transition of the first UUT $\phi_2$ clock pulse that occurs after the VMA signal goes high.

Regardless of the time at which the UUT ON signal goes high to switch the test system to the UUT test state, the next UUT $\phi_2$ clock pulse toggles J-K flip-flop 146 to take the UUT ON signal low and thus clocks flip-flop 144 and disables AND gate 152. This causes the signal supplied to the J and K input terminals of flip-flop 146 to go low and prevent further circuit response to the UUT $\phi_2$ clock pulses until microprocessor circuit 42 loads interval timer 142 with the next timing value.

In view of the above-described operation of timing control 140, it can be recognized that the test system is in the pod processor state ($\overline{\text{UUT ON}}$ signal high) except for a single period of the UUT $\phi_2$ clock signal that occurs a predetermined number of clock periods after interval timer 142 is loaded by microprocessor 42. Thus, the depicted arrangement provides the operation described relative to the test arrangement depicted in FIG. 1. Moreover, since the UUT ON signal and the UUT $\phi_2$ clock signal are both at a logical high level during the final portion of the time in which the test system is in the UUT test state, it can be recognized that NAND gate 148 of FIG. 2 provides the desired signal for latching the address, data, status and control signals supplied by UUT 18 via protection unit 34.

In the arrangement of FIG. 2, when the test system operator selects operation in the RUN UUT mode wherein the microprocessor circuit 42 is interconnected with UUT 18 to execute the operational sequence normally associated with operation of the unit being tested, pod I/O unit 52 supplies a logical low signal to one input terminal of NOR gate 150 and interval timer 142 is loaded with a timing value which allows the system to perform the necessary housekeeping operations and supply signals to registers 132 which disable all circuits within driver unit 134 and enable each buffer circuit within status buffer unit 130. Thus, when the UUT ON signal goes high to switch the test system to the UUT test state (i.e., when J-K flip-flop 146 is toggled by the positive transition of the first UUT $\phi_2$ clock pulse that occurs after the output provided by interval timer 142 goes low), all address, data, control and status leads of microprocessor circuit 42 are coupled to the corresponding leads within UUT bus 32 (FIG. 1). Moreover, since this causes the signal at the second input terminal of NOR gate 150 to go low, a logical high signal is coupled to the set terminal of J-K flip-flop 146 to thereby maintain J-K flip-flop 146 in the set state and prevent the circuit arrangement of FIG. 2 from reverting to the pod processor state. Thus, when the test system operator selects the RUN UUT mode of operation, microprocessor circuit 42 of pod processor 12 serves as the microprocessor circuit of the assembly or system being tested (UUT 18 in FIG. 1) to permit the unit under test to execute the normal UUT operational sequence, including any diagnostic routines stored in UUT memory (e.g., UUT ROM 28 in FIG. 1).

To permit the arrangement of FIG. 2 to be switched from the RUN UUT mode to the normal test mode wherein the arrangement sequences between the pod processor and UUT test states, the reset terminal of microprocessor circuit 42 is connected to the output terminal of an OR gate 154 having its input terminals connected for receiving a reset signal that is supplied by main frame 10 and the UUT reset signal that is supplied by status gates 130. With this arrangement, when the system is in the RUN UUT mode, any reset signals provided by the UUT will be coupled to microprocessor circuit 42 in the desired manner. Additionally, the test arrangement can be returned to a normal test mode by coupling a system reset signal to interface pod 12 from main frame 10 to reset microprocessor circuit 42, registers 132, interval timer 142 and pod I/O 52. When this occurs, the $\overline{\text{RUN UUT}}$ signal is set high by pod I/O unit 52 to thereby remove the set signal from J-K flip-flop 146 and allow the next UUT $\phi_2$ clock pulse to toggle J-K flip-flop 146 and clock flip-flop 144 so that the test system reverts to the pod processor state.

A greater understanding and appreciation of the above-described structural and operational aspects of this invention can be obtained by considering the test sequences that are employed by the presently-preferred embodiments of the invention relative to functional testing of the UUT bus structure, UUT RAM circuits, UUT ROM circuits, and to a somewhat more limited degree, the UUT I/O circuits. In this regard and as shall be described in more detail, each of these functional tests involves a sequence of test steps wherein the system alternates between the pod processor state and the UUT test state to perform read and/or write-read operations at addresses of UUT memory space that are associated with RAM storage, ROM storage, or with I/O registers of a type that will respond to the test sequence. For example, during the test sequence in which the integrity of the UUT bus structure is verified (hereinafter referred to as the BUS TEST) the test system detects which, if any, lines of the data and addresses buses are shorted to another line within that bus and which, if any, of the address data cannot be driven to a desired logic state (i.e., are "stuck"). Both of these tests are effected by: (a) formulating an address or data signal during a first sequence of operations in the pod processor state; (b) switching the system to the UUT state for a period of time that corresponds to a single UUT bus cycle to apply the address or data signal to the UUT bus and to sample the signal on the bus (i.e., the response) with associated test system circuitry (e.g., drivability register 40 in FIG. 1 and latches 104 or 106 in the arrangement of FIG. 2); and (c) initiating a sequence of operations to read and analyze the resulting data when the test system reverts to the pod processor state. To ensure that the control lines of the UUT bus are not "stuck" and can be driven to a desired logic state, the presently-employed BUS TEST incorporates a sequence wherein the test system: (a) first operates in the pod processor state to either initiate microprocessor activity that should result in the desired state of a control line to be tested or to enable a circuit that will drive that control line to a desired logic level (zero or one); (b) switches to the UUT test state for a single bus cycle to apply the stimulus and sample the control line signal (e.g., with control latch 110 of FIG. 2); and, (c) when the test system reverts to the pod processor state, reads the stored control line signal to verify that the control line was driven to the desired logic level.

To test each group or block of UUT ROM storage that is accessed by a series of consecutive address codes, the presently-preferred embodiments of the invention alternate between the pod processor state and the UUT test state to execute a test routine that formulates signals for accessing the data stored at consecutive addresses of the block of UUT ROM being evaluated (while in the pod processor state). Each time the test system reverts to the pod processor state, the accessed data is read (i.e., from drivability register 40 of FIG. 1 or data latch 104 of FIG. 2) and is processed so as to generate a 16-bit maximal length pseudorandom binary sequence that is uniquely associated with the data stored in that block of UUT ROM. This binary sequence (in hexadecimal code) is compared with the hexadecimal "signature" that will result if the block of ROM is fully operative and a go/no-go functional indication is coupled to the circuitry of main frame 10 for decoding and display on alphanumeric display unit 90 of FIG. 1.

In the presently-preferred embodiments of the invention the above-mentioned pseudorandom binary sequence or "ROM signature" is obtained by first obtaining a preliminary hexadecimal signature for the sets of binary signals that are stored at corresponding bit locations within each byte of storage provided by that block of ROM and then combining the preliminary hexadecimal signatures to obtain a single hexadecimal ROM signature. More specifically, as is known to those skilled in the art, a pseudorandom binary sequence, x(n) can be obtained from a series of binary signals by application of the mathematical expression:

$$x(n) = T[x(O) \oplus x(n-a) \oplus x(n-b) \oplus x(n-c) \oplus x(n-d) \oplus \text{input}]$$

where T denotes a cyclic rotation one place to the right, $\oplus$ denotes the exclusive-OR operation, and a, b, c, and d are distinct integers of the set (1, 16). Typically, a 16-bit sequence is utilized for signal analysis or "signature" purposes. For example, in one arrangement that is commonly used in the computer industry and known as the "CRC-16" system (16-bit cyclic redundancy check) utilizes three previous signal values per cycle rather than the four previous values indicated above, with the selected integers being 16, 15 and 2. In contrast, the signature analysis equipment being manufactured by Hewlett-Packard of Palo Alto, California employs four signal values each cycle and uses the integers 16, 12, 9 and 7.

Regardless of which combination of integers is chosen for use in the above mathematical expression, the algorithm is easily implemented as the test system of this invention switches between the UUT test pod processor states since little memory and only the logical exclusive-OR operation is required. In this regard, the presently-preferred embodiments of the invention sequentially access each address of the ROM being tested and performs parallel computation of a 16-bit sequence for each bit location in the stored data word. The sequences are then processed to a single sequence by sequentially accessing elements of the derived binary sequences (e.g., the first element of the second binary sequence is accessed following the sixteenth element of the first binary sequence, etc.) so that the algorithm yields a single 16-bit pseudorandom sequence that is utilzed (in hexadecimal form) as the ROM signature.

The preferred embodiments of the invention provide both a relatively rapid test procedure for evaluating a block of UUT RAM storage (hereinafter referred to as the RAM-SHORT TEST) and an optional procedure that is more exhaustive and hence time-consuming (hereinafter referred to as the RAM-LONG TEST). The RAM-SHORT test includes three separate operational sequences in which the test system alternates between the pod processor state and the UUT test state. In the first of these three test sequences, the test system verifies that data can be written into each byte of RAM storage by executing a sequence in the pod processor state which formulates the desired address signal and establishes the stimulus to be applied to the data lines (all zeroes or all ones). The test system then switches to the UUT test state and attempts to write the stimulus at the selected RAM address and reverts to the pod processor state and verifies that the desired address data signals were applied to the UUT bus. The test system is then prepared for a "dummy read" by sequencing the microprocessor circuit in the pod processor state to establish an appropriate address and the necessary control signal and is switched to the UUT state to read the data at that address. This "dummy read" sequence ensures that the data leads of the UUT address bus do not remain charged to the potentials applied during the sequence in which all ones or all zeroes were written into the RAM storage location being tested and a dummy read address that corresponds to the UUT reset address (hexadecimal address FFFF with a MC-6800 microprocessor) is generally utilized. With the UUT bus discharged and the test system in the pod processor state, a sequence is executed to initiate a read operation at the UUT RAM address being tested and the test system is switched to the UUT test mode to perform the read operation and latch the data at that address into test system memory (i.e., drivability register 40 in FIG. 1 or data latch 104 of FIG. 2). When the test system reverts to the pod processor state, a sequence is executed which compares the data read from the subject address of RAM memory with the data previously written at that address. If the data is the same, the above-discussed sequence is repeated to determine that both all zeroes and all ones can be written into each and every address of UUT RAM storage.

The second test sequence of the RAM-SHORT TEST performed by the present embodiments of the invention verifies that the data lines extending between the UUT RAM circuits and the UUT bus are electrically isolated from one another. During this portion of the test procedure, the test system alternates between the pod processor and UUT test states to: (a) attempt to write zeroes into all but one bit location of a particular UUT RAM address; and (b) read the signal that is stored at the selected UUT RAM address to ensure that it identical to the data signal coupled to that address during the UUT write operation. If the data read from memory corresponds with the data coupled to the memory, the signal that was written into RAM storage is complemented so that all bit locations except one contain ones and the process is repeated. If this signal is successfully written into the storage locations of the selected UUT RAM address, the process is continued until it is determined that both a logical one and a logical zero can be written into each bit location of the selected UUT RAM address without causing the same logic level to be stored at another bit location of that address.

In the third portion of the presently-employed RAM-SHORT TEST, a test procedure is executed to detect address decoding errors within the UUT circuitry. In this regard, the sequence effected determines to a high degree of confidence whether or not all bits of the RAM address signals are fully decoded, i.e., that writing information into one storage location of a UUT RAM circuit does not change the contents of any other UUT RAM storage location that is accessed via the same decoding network (i.e., a storage location within the same block of RAM storage). To accomplish this, the test system sequentially switches between the pod processor and UUT test states to address each sequential RAM storage location within the block of UUT RAM circuitry being tested and write a pseudorandom data word that is generated while the test system is in the pod processor state into that storage location. Suitable pseudorandom data words can be generated, for example, by shifting the binary sequence that corresponds to the address to be accessed by a predetermined number of data bits, performing an "exclusive-OR" with that binary number and the address and truncating the result to obtain a data word of the required bit length. Regardless of the technique utilized to generate the pseudorandom data words, when the sequence of storing such a data word at every UUT RAM address of interest is complete, the test arrangement is sequenced to read the data stored at each such address and compare it with the data that was generated for storage at that address. If one or more bits of the signals that are read from memory differ from the corresponding bits of the data signals that were directed to the same memory location, it can be determined easily which bits are not properly decoded and a suitably coded digital signal is coupled to main frame 10 for decoding and display by alphanumeric display unit.

The alternative RAM-LONG TEST of the presently-preferred embodiments of the invention includes the two sequences of the RAM-SHORT TEST which verify that data can be stored at each address of the block of UUT RAM being tested and that the data lines connected to that block of RAM are electrically isolated from one another (i.e., are not "shorted"). To provide maximum testing capabilities at the expense of additional testing time, the RAM-LONG TEST includes a routine for detecting address decoding errors wherein the test system: (a) operates in the pod processor state to prepare the microprocessor circuit 42 for writing numeral 0000 (hexadecimal) at a particular address of the block of RAM being tested; (b) switches to the UUT test state to write 0000 (hexadecimal) at the selected address; (c) sequences between the pod processor state and the UUT test state to toggle one bit of the address signal and write FFFF at the "new" or toggled address, (d) sequences between the pod processor state and the UUT test state to read the data stored at the original address; (e) reverts to the pod processor state and sequences to determine whether the retrieved data includes any binary ones which indicates that the address signal is not fully decoded relative to the toggled bit location and, if no binary ones are detected; (f) sequences to prepare microprocessor circuit 42 for writing 0000 (hexadecimal) at the original test address during the next UUT test period, repeats steps (b) through (g) with a different bit of the address signal being toggled; and, (i) continues until all possible address combinations have been generated for that particular block of RAM (i.e., for the group of consecutive address signals that access RAM storage).

In addition, the RAM-LONG TEST that is presently utilized in the practice of this invention includes a test routine to determine whether the block of RAM storage locations being tested exhibits "pattern sensitivity", which refers to a fault condition wherein data patterns cause particular random errors to occur at one or more bits of the stored data even though a data word can be successfully written into the associated byte of storage, no data lines are shorted and there are no address decoding errors. In the presently-employed embodiments of the testing system of this invention, the pattern sensitivity test is effected by: (a) sequencing between the pod processor and UUT test states to write data into the RAM memory space that establishes a starting pattern (e.g., all zeroes); (b) accessing the word of data stored at the first address of the block of RAM and, after verifying that it corresponds to the data word previously written into that location, writing a different data word at that RAM address; (c) advancing the RAM address signal to verify that the data word that was previously stored at that location has not changed and to write a new data word at that address; and (d) when that word is written into all bytes of RAM storage, establishing a different data word, and repeating both steps (b) through (d) until all possible data words have been written into each RAM location.

The I/O TEST utilized in the presently-preferred embodiments of the invention is performed in the same manner as the above-discussed initial test sequence of the RAM-SHORT TEST and the RAM-LONG TEST wherein the test system is sequenced to determine whether data can be written into the accessed address location. However, depending on the particular I/O register being tested, it may or may not be possible to successfully write a binary one or zero into each and every bit location. For example, although one I/O register may be completely responsive to an attempt to write a data word into the register, an attempt to write data into another I/O register can result in storage of only a single bit of the data word. Thus, in the I/O TEST that is conducted with this invention, the test system is sequenced in the pod processor state to establish an address signal that will access the UUT I/O register to be tested and to establish a digitally-encoded signal having either all ones or all zeroes at bit locations which correspond to the write-responsive bit locations of the I/O to be tested. The system the switches to the UUT test state, applies the address and data signal and reverts to the pod processor state. After formulating and executing a dummy read operation in the manner discussed relative to the procedures for testing RAM storage locations, the system formulates and executes a read operation at the UUT I/O address being tested and the process is repeated to ensure that both ones and zeroes can be written into all bit locations of that particular I/O register specified as being write responsive.

As is demonstrated by the above discussion, practice of this invention to effect each of the above-discussed functional tests requires a set of "test descriptors" wherein each test descriptor specifies the type of circuit block to be evaluated (RAM, ROM or I/O); the beginning and ending address for that particular block of UUT memory; and the ROM signature (if a block of ROM is to be tested) or the write-responsive bits (if I/O is to be tested). These test descriptors collectively define the use that is being made of the UUT memory space and thus the collection of descriptors applicable to a particular UUT is referred to herein as the UUT memory map. It will be recognized by those skilled in the art that the documentation and time required to precisely determine a memory map for a microprocessor-based assembly or system is not always available. Moreover, in situations such as field service operations that attempt to service a wide range of different microprocessor-based assemblies, the time and effort involved in obtaining the memory map for each assembly or system to be tested may be prohibitive. As shall be described in the following paragraphs, the test system of this invention is configured and arranged for use under virtually all situations and conditions, including those in which the test set user has no knowledge of the unit to be tested other than the type of microprocessor circuit employed.

Considering first the situation in which detailed documentation is available, it should be recalled that main frame 10 is itself a microprocessor-based system that is programmed for receiving instructions from a keyboard 88 and for displaying information on an alphanumeric display unit 90. Further, as was discussed relative to FIG. 1, main frame 10 includes a mass memory unit 82 capable of storing test routines that are read into mass memory 82 from a tape or disk or that are programmed into the system through operation of main frame keyboard 88. In the presently-preferred embodiments of the invention, main frame 10 is programmed so that it queries or prompts the test set operator for test descriptors whenever the ROM TEST, I/O TEST, RAM-SHORT TEST or RAM-LONG TEST are selected and so that the test descriptors stored in the test system memory will be utilized if the operator so chooses. For example, when the RAM-SHORT TEST is selected, these embodiments will display the message "RAM-SHORT AT . . . " to prompt the test set operator to enter the beginning address of the block of RAM storage he or she wishes to evaluate. If the operator responds by entering an address via keyboard 88, the microprocessor system within main frame 10 will sequence to request entry of the last address of the block of RAM to be examined. On the other hand, if the test set operator elects to execute the test routine at the test descriptors stored in test system memory, he or she depresses a key which commands the system to execute without entering the initial address and the microprocessor system of main frame 10 sequences to access the first stored RAM test descriptor.

Turning now to the manner in which a test system of this invention provides for functionally testing microprocessor-based assemblies and systems without previous access to a memory map for that assembly or system, it should be recognized at the outset that the procedure employed is basically heuristic in nature and is based on various postulates and assumptions relating to common practices and conventions employed in the design of microprocessor-based assemblies and systems.

First, it is well-known to those skilled in the art that all microprocessor-based systems include numerous addresses that are not used and often contain many separate blocks of RAM, ROM, and I/O. Thus, the test routine utilized by the invention (hereinafter referred to as the LEARN mode of operation) must not only provide a test descriptor for each individual block of RAM, ROM and I/O, but must recognize these elements in the presence of unused addresses. In the LEARN mode of the presently-preferred embodiments of the invention, the unused addresses are referred to as being "nonexistent" memory, with groups of consecutive addresses which do not meet the LEARN mode ROM, RAM or I/O criteria being referred to as blocks of nonexistent memory.

As those of ordinary skill in the art also recognize, in situations wherein less than one half of the available address codes are required, it is common microprocessor design practice not to use one or more of the available address lines. When this occurs, if the unused line is not utilized for a different function such as that commonly called "chip selection" which selectively enables and disables a RAM, ROM or other logic device, the unused line will constitute a "don't care" bit in the address signal in that the same element of the microprocessor-based assembly or system will be accessed regardless of the logic state of that particular bit. This situation is referred to hereinafter as "aliasing", a term that has come into use because two address codes are associated with a single byte of RAM or ROM storage or with a single I/O register. For example, if the address line associated with the most significant bit of a 16-bit address signal is not used, all addresses having a decimal equivalent of n that lies between zero and 32,767 are aliased by an address of n+ 32,768.

As shall be described in more detail hereinafter, the sequence employed in the LEARN mode of the presently-preferred embodiment of the invention is established to detect aliased addresses so as to minimize the number of test descriptors of the memory map that is empirically derived during operation in the LEARN mode to thereby reduce test system storage requirements and reduce the testing time required when the empirically-derived memory map is utilized to functionally test microprocessor-based assemblies or systems of the same type. In this regard, since a test system of this invention may be utilized with relatively complex microprocessor-based systems that include numerous blocks of RAM, ROM and I/O, it is highly desirable to eliminate redundant test descriptors, which would result if aliasing is not detected. For example, the presently-preferred embodiments of the invention provide storage for 100 test descriptors (i.e., in mass memory 82 of main frame 10) and test capabilities would be reduced if memory maps developed in the LEARN mode contained a substantial number of aliased addresses. The increased testing time that would result if the test procedure of the invention is conducted at both the actual and aliased addresses of ROM, RAM and I/O would be especially apparent in the previously discussed RAM-LONG TEST which can require on the order of two to four hours for the testing of 64K×8 of memory.

In view of the above-discussed characteristics of conventional microprocessor-based systems, the need to minimize the size of the memory map empirically derived by the invention in the LEARN mode, and a need to execute the LEARN mode in a reasonable amount of time, the presently-preferred embodiments of the invention are configured and arranged to execute the LEARN mode by switching between the pod processor and UUT test states to supply each address code of the microprocessor-based assembly or system of interest and determine whether an attempt to write data at each particular address is totally successful (i.e., the address is write-responsive), data can be written into less than the full number of storage bits associated with the address (i.e., the address is partially write-responsive), or that data cannot be written into any bit of that address (i.e., the address is "read-only"). As the test system sequences through the LEARN mode, the results at each address in effect are compared with the results at previous address to:

(a) classify a group of 64 consecutive address as a subblock of RAM if each address is totally write-responsive and if each address is a distinct memory location (i.e., the addresses are fully decoded so that writing a data word at any address of the subblock will not change a data word stored at another address of the subblock);

(b) classify a group of 64 consecutive addresses as a subblock of ROM if each address is read-only and if: (i) none of the physical address lines (e.g., address lines 0–5 when the address increment is unity) are don't-care bits, and (ii) the data is not the same as the low order portion of the address;

(c) classify each address that is either partially write-responsive or is totally write-responsive but fails to meet the criteria for being within a subblock of RAM as a subblock of I/O; and (d) classify all addresses that are not included in a subblock of RAM, ROM or I/O as NONEXISTENT.

In addition, the presently-preferred embodiments of the invention also require that each LEARN mode RAM and ROM subblock begin at an address wherein the six lowest most significant bits exhibit a decimal equivalent of zero. Both this condition and the condition that RAM and ROM subblocks span at least 64 consecutive addresses reflect virtually universal microprocessor system design practices and significantly reduce the time required for execution of the LEARN mode without substantial sacrifice in the accuracy of the resulting memory map. In this regard, although a memory map that is empirically derived when the test system of this invention operates in the LEARN mode in all probability will not correspond exactly to the actual memory map of the assembly or system to be tested, the derived memory map has been found to be precise enough to permit highly reliable functional testing of the microprocessor-based system or assembly. Thus, the LEARN mode permits functional tests to be performed on microprocessor-based assemblies and systems whose numbers do not warrant development of a precise memory map and suitable programming of the test system (i.e., main frame 10 of FIG. 1) and also permits testing of relatively complex microprocessor-based systems prior to the time at which a precise memory map or a detailed test program is available.

To generate an empirically-derived memory map of minimal size, the sequence employed in the LEARN mode of the presently-preferred embodiments of the invention tests each subblock of RAM, ROM and I/O for aliasing and adds a hexadecimal "aliasing indicator" to the test descriptor for that subblock which indicates the aliased bits of the subblock (e.g., an aliasing indicator of numeral 3000 indicates that the thirteenth and fourteenth bits are aliased so that an address of n has an aliased address at n+4,096 n+8,192 and n+12,288). In the practice of the invention, an aliasing indicator is derived as soon as the test system classifies a subblock as ROM, RAM or I/O. The subblock test descriptor is then compared with subblock test descriptors determined during the previous portion of the LEARN mode sequence to combine subblocks of identical nature that occupy adjacent positions in address space and, based on the aliasing indicator, to eliminate aliased subblocks. More specifically, when the sequence employed in the LEARN mode detects a subblock of ROM, the test system is sequenced to read the data stored at each of the 64 subblock addresses while alternatively switching the signal supplied at each bit of the system address code that exhibits a significance of 64 or greater (i.e., the seventh through most significant bit of the address signal) between a logical zero and a logical one. If the two data words that are read at each of the 64 subblock addresses are identical as a particular bit of the address signal is toggled, the address bit being toggled is aliased and the aliasing indicator for the subject subblock of ROM is established or modified accordingly.

When a subblock is classified as RAM, the aliasing indicator is derived by: (a) writing a specific data word (such as all zeroes) into one storage location within that subblock of RAM (e.g., the storage location wherein the six lowermost bits of the address code is zero); (b) toggling one of the address bits that exhibits a significance of 64 or greater (i.e., the seventh through most significant bit of the address code) and writing the complement of the signal utilized in step (a) (e.g., FFFF) at the "toggled address"; (c) reading the data stored at the original or untoggled address to determine aliasing of the toggled address bit by detecting whether the original data word is still stored in the RAM subblock; and (d) repeating steps (a) through (c) for all address bits between the seventh most significant bit and the most significant bit.

The procedure utilized to determine the aliasing indicator of a subblock of I/O depends on the particular type of microprocessor circuit employed by the microprocessor-based assembly or system of interest and, more specifically, on the "basic address increment" employed by that microprocessor circuit. For example, in the previously-mentioned MC-6800 device, the basic address increment is unity and in other microprocessor devices such as the 9900, manufactured by Texas Instruments Incorporated of Dallas, Texas, the basic address increment is two since such devices in effect permit addressing of one half a word of memory. Regardless of whether the addressing increment is one, two, or more, the LEARN mode sequence that is utilized in the presently-preferred embodiments of the invention to determine the aliasing indicator for each address that is classified as a subblock of I/O involves a test sequence substantially identical to that utilized in establishing the aliasing indicator for a subblock of RAM with the exception that the address bits that are toggled start with two times the basic address increment (e.g., the second, third or subsequent address bit) and extend to the most significant address bit. As is the case in the procedure for determining the aliasing indicator of a subblock of RAM, if the toggling of an address bit produces a change in the data stored at the I/O address, that particular bit of the address signal is aliased and the test descriptor for that subblock of I/O is established accordingly.

Each time that operation in the LEARN mode is initiated, all test descriptors and aliasing indicators that fall within the address range of interest are eliminated from the test system memory map before the test descriptor for the first subblock detected by the test system is entered into memory. If the next detected subblock is identical as to type and aliasing and if the lower address thereof is one address unit greater than the uppermost address of a test descriptor stored in system memory during the current LEARN operation, the two subblocks are combined. For example, if the test descriptor for the first subblock detected in a particular microprocessor-based system is "000 003F ROM 2000 xxxx" (i.e., 64 bytes of ROM between address code 0 and 64, with the fourteenth most significant bit of the address signal being aliased and "xxxx" indicating the hexadecimal ROM signature, which is not determined until the entire memory map has been formulated), and the test descriptor for the second subblock detected during that LEARN mode is "0040 007F ROM 2000 xxxx", the two descriptors are combined to yield "0000 007F ROM 2000 xxxx".

As the test system sequences through the address space of the microprocessor-based system or assembly of interest, situations can be encountered wherein two test descriptors include a common segment of the address space, with the aliased bits of one descriptor being a subset of the aliased bits in the other descriptor. In such a situation, the presently-preferred embodiments retain the test descriptor with the fewer number of aliased bits and modify the descriptor with the higher aliasing indicator to remove the segment of address space defined by the other descriptor. In addition, if the aliasing indicator and all other elements except the address identifiers of a newly-detected subblock correspond with a subblock already included in the memory map, the present embodiments of the test arrangement are programmed to retain the subblock with the lowest address in the memory map.

The above-discussed tests for combining test descriptors during generation of the LEARN mode memory map have been experimentally developed in view of the objective of generating a precise memory map that includes a minimal number of test descriptors. In particular, although the described criteria will sometimes fail to eliminate one or more aliased memory subblocks from the derived memory map, relatively reliable detection of memory subblocks that are controlled by an address line that is used as a chip select line is provided.

When all of the LEARN mode test descriptors have been detected and combined in the above-described manner, the test system determines the ROM signature for each block of ROM by sequentially accessing each ROM storage address and computing the hexadecimal ROM signature in the manner discussed relative to the ROM TEST of the presently-preferred embodiments of the invention. With the derived memory map thus complete, the test system can be utilized to perform any and all of the previously-described functional tests on units having the same configuration as the microprocessor-based system or assembly that was interrogated during the LEARN mode.

As was discussed relative to FIG. 1, the present embodiments of the invention include a probe control and measurement unit 92 and a probe unit 94 which operate in synchronization with the test system so as to sample the logic level at a selected circuit node (or inject a desired signal) each time the test system switches to the UUT test state and valid data signals are available (or address valid signals are being provided by microprocessor 42).

With reference to FIG. 3, the portion of the presently-utilized probe arrangement which indicates whether a monitored circuit node is at a logical high potential, a logical low potential, an invalid logic level or is switching between some combination of these three conditions includes a buffer amplifier 160 having the input terminal thereof coupled to an electrode 162 via a resistor 164. The electrode 162 is included in the tip of the system probe (94 of FIG. 1) for contacting the monitored circuit node. A resistor 165 is connected between circuit common and the input terminal of buffer amplifier 160 forms a voltage divider which controls the amplitude of the signal coupled to the buffer amplifier. As is shown in FIG. 3, the output terminal of buffer amplifier 160 is connected to an input terminal of a first voltage comparator 166 and to one input terminal of a second voltage comparator 168. The second input terminals of voltage comparators 166 and 168 are respectively connected to reference potentials $V_H$ and $V_L$, which correspond to the acceptable high and low threshhold voltages for the type of logic circuitry that is employed in the microprocessor-based system being tested. With this arrangement, comparator 166 couples a logical high signal to the input terminal of a D-type latch circuit 170 and to one input terminal of a selector unit 172 whenever the signal level at probe electrode 162 exceeds the threshold value for a logical high signal. Similarly, comparator 168 couples a logical high signal to the input terminal of a D-type latch circuit 174 and to a second input terminal of the selector unit 172 whenever the signal level at probe electrode 162 exceeds the threshold value for a logical low signal.

Latches 170 and 174 are clocked by the signal provided by a second selector unit 176 which is controlled by an interface register 178. Interface register 178 is coupled to the bus 77 of main frame 10 (FIG. 1) for receiving signals supplied either by a test sequence that is stored in the memory of main frame 10 or through operation of keyboard 88 of FIG. 1. In either case, when interface register 178 activates selector units 172 and 176, the circuit arrangement depicted in FIG. 3 operates in the previously-mentioned synchronous mode with the timing signal provided by timing control and probe sync unit 54 being coupled to the clock inputs of latches 170 and 174 via selector 176 and the signals provided at the Q output terminals of latches 170 and 174 being coupled to the input terminals of first and second retriggerable monostable multivibrators 180 and 182 by means of selector unit 172. On the other hand, when the depicted arrangement is not operated in the synchronous mode, latches 170 and 174 are not utilized and selector 172 couples the output terminals of comparators 166 and 168 to the input terminals of retriggerable monostable multivibrators 180 and 182 (respectively).

Continuing with the description of the arrangement of FIG. 3, the input and output terminals of retriggerable monostable multivibrator 180 are connected to the input terminals of an OR gate 184 and the input and output terminals of multivibrator 182 are connected in an identical manner to the input terminals of an OR gate 186. As is shown in FIG. 3, the output terminals of OR gates 184 and 186 are respectively coupled to the first input terminal of an AND gate 188 and an AND gate 190, with the output terminals of AND gates 188 and 190 being connected to indicators 96 and 98 (depicted as light-emitting diodes in FIG. 3).

In this arrangement, monostable multivibrators 180 and 182 exhibit a triggered period, T, that is substantially greater than the period of the clock signal utilized in the microprocessor-based system or assembly being tested. Thus, monostable multivibrators 180 and 182 in effect serve as pulse stretchers so that monostable multivibrator 180 supplies a logical high signal to AND gate 188 if the signal at electrode 162 is greater than the acceptable voltage threshold for a logic level high and monostable multivibrator 182 maintains the signal supplied to AND gate 190 at a logical high if the potential at electrode 162 is below the threshold voltage for the logical low signal of the system being tested. Further, since the multivibrator period T is substantially greater than the time required for the test system to effect numerous operations in the UUT test state and hence supply a large number of signal pulses to the clock terminals of latches 170 and 174, it is possible for both the monostable multivibrator 180 and the monostable multivibrator 182 to supply a logically high signal to the associated AND gate. That is, if the signal potential at electrode 162 exceeds the logical high threshold value during one or more of the periods of time in which the test arrangement is in the UUT test state and is below the logical low threshhold value during one or more other periods of time in which the test arrangement is in the UUT test state, both OR gate 184 and OR gate 186 will supply a logically high signal.

With continued reference to FIG. 3, both the second input terminals of AND gate 188 and AND gate 190 are connected to the $\overline{Q}$ output of a monostable multivibrator 192 having a triggered period of T/2 and having the Q output terminal thereof connected for clocking a monostable multivibrator 194 that exhibits a triggered period of T. To complete the arrangement, the output signal supplied by a negative NAND gate 196, which has its input terminals connected for receiving the signals supplied by comparators 166 and 168 (via selector 172), is coupled to the input of a filter network 198. The output terminal of the filter network 198 is coupled to one input terminal of an AND gate 200 having the output terminal thereof connected to clock multivibrator 192 and having the second input terminal thereof connected to the Q output terminal of monostable multivibrator 194. In this arrangement, negative NAND gate 196 supplies a logically high signal to filter network 198 whenever the signal at electrode 162 is at an invalid logic level. Filter 198 exhibits a low-pass transfer characteristics which prevents signal transitions within the acceptable limits of the system of interest from being coupled to AND gate 200. Thus, if an invalid logic level appears at electrode 162 for a period of time that exceeds the acceptable system transition time, monostable multivibrator 192 is triggered to, in turn, trigger monostable multivibrator 194. Since the $\overline{Q}$ output of monostable multivibrator 192 disables AND gates 188 and 190, the indicators 96 and 98 cannot be energized during this period of time. However, since the signal period of monostable multivibrator 194 is approximately twice that of monostable multivibrator 192, AND gates 188 and 190 are sequentially enabled and disabled for a period of time approximately equal to T/2 whenever an invalid signal level appears at electrode 162.

In view of the above-discussion it can be recognized that indicators 96 and 98 are energized in a manner that provides a visual indication of various conditions that can occur at the monitored circuit node. In this regard, when an indicator 96 or 98 is continuously energized, signal potentials of the corresponding logic level are being detectd at electrode 162. Thus, indicator 96 will emit a steady indication when the signal at electrode 162 is high during each monitored UUT test state; indicator 98 will be energized if the logic signal at the monitored node is low during each UUT test state; and both indicators will be energized if both high and low logic levels are detected during the monitored period. Additionally, the above-discussed operation of monostable multivibrators 192 and 194 will cause an energized indicator 96 or 98 to blink if both valid and invalid logic signals are detected. Thus, if both logically high signal levels and invalid signal levels are present during different periods of time in which the test system sequences to the UUT test state, indicator 96 will be alternately energized and deenergized. In a similar manner, indicator 98 will be repeatedly energized and deenergized if both logically low and invalid signal levels are detected at the monitored node and indicators 96 and 98 will energize and deenergize in unison with one another if all three logic conditions are occurring at different periods of time in which the probe is in contact with the monitored circuit node.

In addition to providing the above-discussed logic level indications, the circuit of FIG. 3 includes a counter circuit 202 and a conventional pseudorandom binary sequence generator 204 of the type utilized to provide signature analysis. As is shown in FIG. 3, the input terminal of the pseudorandom binary sequence generator 204 and the clock terminal of counter 202 are connected to receive a logical high signal whenver the potential at electrode 162 exceeds the threshold voltage for a logical high signal. Thus, counter 202 functions as a conventional event counter and supplies a signal to a register 206 which indicates the number of positive transitions that occur during the time period in which the probe contacts the circuit node of interest. Since register 208 is coupled to the bus 77 of main frame 10, this information can be displayed on alphanumeric indicator 90 or can be utilized in a programmed test sequence that is stored within the memory of main frame 10.

Since pseudorandom binary sequence generator 204 is clocked by the signal supplied from timing control and probe sync unit 54, the arrangement of FIG. 3 permits synchronized signature analysis without requiring the test set operator to provide starting and stopping signals. For example, in the presently-preferred embodiments of the invention, the microprocessor system within main frame 10 is programmed and arranged to generate various test stimuli such as a digital RAM signal, a sequence of "walking zeroes" and various toggled data signals. Thus, main frame 10 can be programmed to automatically reset pseudorandom binary sequence generator 204 and supply the desired system stimuli after the test set operator has been instructed to position the probe at the proper circuit node. At the conclusion of such a sequence, the signature supplied by pseudorandom binary sequence generator 204 is available in an interface register 210 for display on the system alphanumeric display unit 90 or for further analysis through execution of one of the programs stored in main frame 10.

In addition, the arrangement of FIG. 3 also includes a register 212 which receives the signals supplied by OR gates 184 and 186 to thereby permit signals representative of the monitored logic signals to be coupled into main frame bus 77 as data signals.

The portion of the circuit depicted in FIG. 3 which permits the test system probe to be used for injecting logic signals into a selected logic node includes a PNP transistor 214 for driving test probe electrode 162 to a logical high state and an NPN transistor 216 for driving test probe electrode 162 to a logical low state. More specifically, in the arrangement of FIG. 3, test probe electrode 162 is connected to the collector electrode of transistor 214 by means of a protective diode 218 and is connected to the collector electrode of 216 by means of a second protective diode 220. The emitter electrodes of transistors 214 and 216 are connected to positive and negative supply voltages (respectively) and capacitors 222 and 224 are connected between circuit common and the emitter electrodes of transistors 214 and 216. In this arrangement, transistors 214 and 216 serve, in effect, as switches, with the conductive state of transistor 214 being controlled by a NAND gate 226 and the conductive state of transistor 216 being controlled by an AND gate 228. As is shown in FIG. 3, the signal supplied by NAND gate 226 is coupled to the base electrode of transistor 214 by parallel-connected resistor 230 and capacitor 232 with the signal supplied by AND gate 228 being coupled to the base electrode of transistor 216 by a similar parallel network that includes resistor 234 and capacitor 236.

Continuing with the description of FIG. 3, one input terminal of NAND gate 226 is connected to the Q output terminal of a J-K flip-flop 238 and one input terminal of AND gate 228 is connected to the $\overline{Q}$ output terminal of flip-flop 238. Since a second terminal of NAND gate 226 and AND gate 228 are connected for receiving a signal supplied by interface register 178, it can be seen that both NAND gate 226 and AND gate 228 are enabled whenever interface register 178 supplies a logical high signal and that J-K flip-flop 238 serves as a selector to determine whether transistor 214 will drive test probe electrode 262 logically high or transistor 216 will drive electrode 162 logically low. In this regard, the third input terminal of NAND gate 226 and the third input terminal of AND gate 228 are connected to selector unit 176 and, depending on the state of selector 176, receive the sync pulses supplied by timing control and probe sync unit 54 (FIG. 1) or clock pulses supplied by an asynchronous clock source 240 that is connected to selector unit 176. Thus, the depicted circuit can operate in a synchronized mode wherein each pulse supplied to probe electrode 162 occurs when the test system is in the UUT test state or, alternatively, the probe can be operated in an asynchronous pulse mode wherein logic pulses are coupled to electrode 162 at a rate determined by asynchronous clock source 240.

In either case, the arrangement of FIG. 3 permits either logical high pulses, logical low pulses or an alternating sequence of logical high and logical low pulses to be provided. More specifically, as is shown in FIG. 3, J-K flip-flop 238 is clocked by the signal provided by selector unit 240 with the J and K input terminals of flip-flop 238 being connected to interface register 178. With this arrangement, if interface register 178 supplies a logical high signal to the J input terminal of flip-flop 238 and supplies a logical low signal to the K input terminal, NAND gate 226 will be enabled and AND gate 238 will be disabled to thereby cause logical high pulses to be supplied to test electrode 162. On the other hand, if interface register 178 maintains the K input terminal of J-K flip-flop 238 at a logical high level and the J input terminal at a logical low, AND gate 228 will be enabled and logical low pulses will be coupled to test electrode 162. If interface register 178 couples a logical high signal to both the J and K input terminals of flip-flop 238, the flip-flop will toggle to thereby cause transistors 214 and 216 to supply a sequence of alternating logical high and logical low signals to test electrode 162.

As many possible embodiments may be made of the invention without departure from the scope thereof, it is to be understood that all matters set forth herein or shown in the accompanying drawing are to be interpreted in an illustrative and not limiting sense.

The embodiments of the invention in which an exclusive property or privilege is claimed are defined as follows:

1. A test system for functionally testing a microprocessor-based assembly of the type wherein a microprocessor circuit communicates with at least one of a random access memory unit, a read-only memory unit and an input/output register via an interconnection bus, and a clock circuit coupling a periodic clock signal to said microprocessor circuit to establish a bus cycle of a predetermined length, said test system comprising:
   a second microprocessor circuit substantially identical to said microprocessor circuit of said microprocessor-based assembly being tested;
   interconnection means for connecting said test system to said microprocessor-based assembly being tested with said test system being connected to replace said microprocessor circuit of said assembly being tested, said interconnection means including means for coupling said clock signal to said second microprocessor circuit;
   memory means, including means for storing instructions and data for programming said second microprocessor circuit, for supplying addressing and data signals;
   switching means for selectively coupling said second microprocessor circuit between a first operational state wherein said second microprocessor is in signal communication with said memory means and a second operational state wherein said second microprocessor circuit is in signal communication with said interconnection means to supply signals to and receive signals from said interconnection bus of said microprocessor-based assembly being tested, said switching means including timing means responsive to said clock signal supplied by said microprocessor-based assembly for switching said second microprocessor circuit into said second operational state at a predetermined time, said second microprocessor circuit being maintained in said second operational state for a single bus cycle each time said switching means switches said second microprocessor from said first operational state to said second operational state.

2. The apparatus as claimed in claim 1 including register means connected to said interconnection means, said register means being responsive to an applied register control signal for storing a signal appearing on said interconnection means at the time said register control signal is supplied to said register means, said switching means including means for supplying said register control signal to said register each time said second microprocessor circuit is switched to said second operational state.

3. The apparatus as claimed in claim 2 wherein register means is also responsive to a second applied register control signal to permit stored signals to be read from said register means by said second microprocessor circuit and said switching means includes means for supplying said second register control signal when said second microprocessor circuit is in said first operational state.

4. The apparatus as claimed in claim 3 wherein said timing means is responsive to an applied timing signal and includes means for switching said second microprocessor circuit into said second operational state after the elapse of a predetermined number of clock periods of said clock signal supplied by said microprocessor-based assembly being tested and said memory means includes instructions and data for sequencing said second microprocessor circuit to supply said timing signal to said timing means.

5. The apparatus as claimed in claim 4 wherein said second microprocessor circuit, said memory means, said register means and said switching means are located in an interface unit that further includes an input/output unit connected in data communication with said second microprocessor circuit; said test system further includes a mainframe assembly that includes a programmable microprocessor system connected in data communication with said input/output unit of said interface unit, said mainframe assembly including data entry means, display means and mainframe memory means collectively configured and interconnected for transmitting data signals to said interface unit for initiating an operational sequence by said second microprocessor circuit that includes at least one transition from said first state to said second state.

6. The apparatus as claimed in claims 1, 3, or 5 including address signal means connected to said interconnection means and arranged for coupling a predetermined address signal to said interconnection bus of said microprocessor-based assembly whenever said second microprocessor circuit is in said first state.

7. The apparatus as claimed in claims 1, 3, or 5 including a probe unit for monitoring logic signal conditions at a selected circuit node of said microprocessor-based assembly being tested, said probe unit including means for supplying a first indication of a first predetermined time duration each time the monitored signal attains a first predetermined level and means for supplying second indication for a period of time that is substantially equal to said first predetermined time duration each time said monitored signal is less than a second predetermined level, said probe unit further including means for disabling said means for supplying said first indication and said means for supplying said second indication for a period of time that is less than said first predetermined time duration each time said monitored signal remains between said first and second predetermined levels for a period of time that is greater than a second predetermined time duration.

8. The apparatus as claimed in claim 7 wherein said means for supplying said first and second indication each include means for sampling the signal level at said monitored circuit node in substantial time coincidence with an applied sync signal and said test system includes means for supplying a sync signal to said means for sampling said signal level each time said second microprocessor is switched to said second operational state.

9. The apparatus as claimed in claim 7 wherein said probe unit further includes signal source means selectively operable to supply of first signal pulse that exceeds said first predetermined level and a second signal pulse that is less than said second predetermined level, the probe unit signal source means also being selectively operable to supply an alternating sequence of said first and second signal pulses.

10. The apparatus as claimed in claim 9 wherein said signal source means supplies each one of said first signal pulses, each one of said second signal pulses and each individual pulse of said alternating sequence of said first and second signal in substantial synchronism with an applied synch signal and said test system includes means for supplying a sync signal to said signal source means each time said second microprocessor circuit is switched to said second operational state.

11. The apparatus as claimed in claim 10 wherein said means for supplying said first and second indication includes means for sampling the signal level at said monitored node in substantial synchronism with said test system sync signal.

12. Apparatus for testing logic circuitry comprising:
a test probe, said test probe including an elctrode positionable in signal communication with a circuit node of logic circuitry being tested:
a first signal indicator for supplying a humanly perceivable signal and being responsive to an applied first control signal;
a second signal indicator for supplying a humanly perceivable signal and being responsive to an applied second control signal;
first signal detection means connected for receiving the signal supplied to said electrode and being connected for supplying said first control signal to said first signal indicator, said first signal detection means including means for supplying said first control signal for a predetermined time, T, each time said electrode supplies the signal of a first predetermined magnitude;
second signal detection means connected for receiving the signal supplied to said electrode and being connected for supplying said second control signal to said second signal indicator, said second signal detection means including means for supplying said second control signal for a predetermined time, T, each time said electrodes supplies a signal of a second predetermined magnitude;
third signal detection means connected for receiving the signal being supplied to said electrode, said third signal detection means including means for disabling said first and said second signal detection means for a period of time less than said predetermined time, T, each time said electrode supplies a signal having a magnitude between said first and second predetermined magnitudes.

13. The apparatus for testing logic circuitry as claimed in claim 12 including signal synchronization means responsive to an applied synchronization signal and including means for coupling said signal supplied by said elctrode to said first, second and third signal detection means in substantial time coincidence with said applied synchronization signal.

14. The apparatus for testing logic circuitry as claimed in claims 12 or 13 including:
a first pulse generator responsive to an applied first pulse control signal and including means for coupling a signal pulse of a first predetermined signal level to said electrode of said test probe;
a second pulse generator responsive to an applied second pulse control signal and including means for coupling a signal pulse of a second predetermined signal level to said electrode of said test probe; and
control means responsive to an applied signal selector signal, said control means including means for individually supplying said first and second pulse control signals to said first and second pulse generators, said control means further including means for supplying an alternating sequence of said first and second signal pulses to said first and second pulse generators.

15. Apparatus for determining a set of responses for a faultless processor controlled device comprising:
memory means containing a predetermined set of instructions;
interconnection means for connecting said apparatus to said processor controlled device; and
apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses; and means included in said memory means to retain said set of responses provided by said apparatus processor means as said set of responses for said faultless processor controlled device.

16. Apparatus for detecting faults in a processor controlled device comprising:

memory means containing a predetermined set of instructions and a predetermined set of responses;

interconnection means for connecting said apparatus to said processor controlled device; and apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide to said memory means a set of responses previously developed from said processor controlled device and (2) a second operational state wherein said apparatus processor means is in communication with said processor controlled device and isolated from said memory means to selectively execute said set of instructions by providing predetermined signals to said processor controlled device and receive signals from said processor controlled device as said set of responses, said apparatus processor means including means for processing said set of responses from said processor controlled device to develop said predetermined signals; and means for detecting a fault when said predetermined set of responses differs from said set of responses from said processor controlled device.

17. The apparatus as claimed in claim 15 or 16 wherein said apparatus processor means includes means responsive to sequential signals in said processor controlled device to change said apparatus processor means between said first and second operational states.

18. The apparatus as claimed in claim 15 or 16, wherein said processor controlled device includes dynamic circuit means, said apparatus including generator means connected to said interconnection means for providing periodic signals to continuously refresh said dynamic circuit means in said processor controlled device.

19. The apparatus as claimed in claim 15 or 16 including drivability sensing means connected to said interconnection means for determining if said predetermined signals provided by said apparatus processor means are provided by said interconnection means to said processor controlled device.

20. The apparatus as claimed in claim 15 or 16 including drivability means for determining which of said predetermined signals have been provided by said interconnection means to said processor controlled device.

21. The apparatus as claimed in claim 15 or 16 wherein said apparatus processor means includes means for selectively providing input signals to said processor controlled device and receiving signals therefrom when said apparatus processor means is in said second operational state.

22. The apparatus as claimed in claim 15 or 16 including power sensing means connected to said interconnection means responsive to the lack of said predetermined signals to provide an indication of the failure of a power supply in said processor controlled device.

23. The apparatus as claimed in claim 15 or 16 including limiting means connected to said interconnection means to limit the value of said predetermined signals and of said set of responses from said processor controlled device.

24. The apparatus as claimed in claim 15 or 16 including probe means operatively connected to said memory means to provide signals indicative of logic levels at selected locations in said processor controlled device.

25. The apparatus as claimed in claim 15 or 16 including probe means operativey connected to said memory means responsive to said predetermined set of instructions to provide signals indicative of logic levels at selected locations in said processor controlled device.

26. The apparatus as claimed in claim 15 or 16 including probe means operatively connected to said memory means for providing signal pulses to selected locations in said processor controlled device.

27. The apparatus as claimed in claim 15 or 16 including probe means operativey connected to said memory means and said apparatus processor means responsive to said apparatus processor means operating in said first or second state to selectively provide signals to selected locations in said processor controlled device in said first or second state or both.

28. The apparatus as claimed in claim 15 or 16 including probe means operatively connected to said memory means and including means operatively associated with said memory means and said probe means to cause said apparatus processor means to provide one of said predetermined signals for detection of said signal by said probe means at selected locations in said processor controlled device.

29. Apparatus for determining a set of responses for a faultless microprocessor controlled device comprising:

memory means containing a predetermined set of instructions;

interconnection means for connecting said apparatus to said microprocessor controlled device;

an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses; and recording means in said memory means to retain said set of responses as said set of responses for said faultless microprocessor controlled device.

30. Apparatus for detecting faults in a microprocessor controlled device comprising:
- memory means containing a predetermined set of instructions and a predetermined set of responses;
- interconnection means for connecting said apparatus to said microprocessor controlled device; and
- an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses; and
- comparison means in said memory means for comparing said predetermined set of responses and said set of responses and providing a visual fault indication when said responses differ.

31. The apparatus as claimed in claim 29 or 30 including switching means in said apparatus microprocessor pod responsive to clock signals from a clock in said microprocessor controlled device to change said apparatus microprocessor pod between said first and second operational states according to said predetermined set of instructions from said memory means.

32. The apparatus as claimed in claim 29 or 30, wherein said microprocessor controlled device includes dynamic circuit means, said apparatus including generator means in said microprocessor pod connected to said interconnection means for providing periodic signals for continuously refreshing said dynamic circuit means in said microprocessor controlled device.

33. The apparatus as claimed in claim 29 or 30 including drivability sensing means in said apparatus microprocessor pod connected to said interconnection means for determining which of said predetermined signals provided by said apparatus microprocessor pod are provided by said interconnection means to said microprocessor controlled device.

34. The apparatus as claimed in claim 29 or 30 including drivability means in said apparatus microprocessor pod for determining if all of said predetermined signals have been provided by said interconnection means to said microprocessor controlled device.

35. The apparatus as claimed in claim 29 or 30 wherein said apparatus processor pod includes means for selectively providing predetermined signals to said processor controlled device and receiving the response signals to said predetermined signals therefrom when said apparatus processor pod is in said second operational state.

36. The apparatus as claimed in claim 29 or 30 including power sensing means connected to said interconnection means responsive to the lack of said predetermined signals and clock signals from said microprocessor controlled device to provide an indication of the failure of a power supply in said microprocessor controlled device.

37. The apparatus as claimed in claim 29 or 30 including limiting resistor circuitry connected to said interconnection means to limit the value of said predetermined signals and of said set of responses from said microprocessor controlled device.

38. The apparatus as claimed in claim 29 or 30 including probe means connected to said memory means to provide visual signals indicative of logic levels at selected locations in said microprocessor controlled device.

39. The apparatus as claimed in claim 29 or 30 including probe means operatively connected to said memory means responsive to said predetermined set of instructions to provide signals indicative of logic levels at selected locations in said microprocessor controlled device.

40. The apparatus as claimed in claim 29 or 30 including probe means operatively connected to said memory means for providing signal pulses to selected locations in said microprocessor controlled device.

41. The apparatus as claimed in claim 29 or 30 including probe means operatively connected to said memory means and said apparatus processor pod responsive to said apparatus microprocessor pod operating in said first or second operational state to selectively provide signals to selected locations in said microprocessor controlled device in said first or second operational state or both.

42. The apparatus as claimed in claim 29 or 30 including probe means operatively connected to said memory means and including means operatively associated with said memory means and said probe means for said memory means to cause said apparatus microprocessor pod to provide one of said predetermined signals for detection of said signal by said probe means at one of said selected locations in said microprocessor controlled device.

43. Apparatus for determining a memory map for a faultless microprocessor controlled device having a removeable microprocessor and an internal clock providing periodic clock signals, comprising:
- main memory means containing predetermined sets of instructions and selectable to provide one of said predetermined sets of instructions;
- interconnection means for connecting said apparatus to said microprocessor controlled device where said microprocessor has been removed;
- pod memory means operatively connected to said interconnection means and said main memory means responsive to said one of said predetermined sets of instructions therefrom to provide a predetermined test sequence and set of stimulation signals;
- a pod microprocessor connected to said pod memory means and said interconnection means sequentially operable in a first operational state to receive said predetermined test sequence and said set of stimulation signals from said pod memory means, operable in a second operational state to execute said predetermined test sequence and provide said set of stimulation signals to said microprocessor controlled device, operable in said second operational state to receive response signals due to said stimulation signals from said microprocessor controlled device and provide said response signals to said pod memory means, and operable in said first operational state to provide said response signals to said main memory means;
- switching means responsive to said periodic clock signals for switching said pod microprocessor between said first and second operational states; and main processor means connected to said main memory means responsive to said response signals to retain said response signals as a memory map for said faultless microprocessor controlled device.

44. Apparatus for detecting faults in a microprocessor controlled device having a removable microprocessor and an internal clock providing periodic clock signals, comprising:
  main memory means containing predetermined sets of instructions and a predetermined faultless map;
  interconnection means for connecting said apparatus to said microprocessor controlled device where said microprocessor has been removed;
  pod memory means operatively connected to said main memory means responsive to one of said predetermined sets of instructions therefrom to provide a predetermined test sequence and set of stimulation signals;
  a pod microprocessor connected to said pod memory means and said interconnection means sequentially operable in a first operational state operatively connected to said pod memory means to receive said predetermined test sequence and set of stimulation signals, operable in a second operational state operatively connected to said microprocessor controlled device to execute said predetermined test sequence by providing said stimulation signals to said microprocessor controlled device, operable in said second operational state to receive response signals due to said stimulation signals from said microprocessor controlled device and to provide said response signals to said pod memory means, and operable in said first operational state to provide said response signals to said main memory means;
  switching means responsive to said periodic clock signals for switching said pod microprocessor between said first and second operational states; and
  main processor means connected to said main memory means responsive to said response signals to establish a device memory map for said microprocessor controlled device, said main processor means including means for comparing said predetermined faultless memory map with said device memory map to determine differences there between whereby faults may be detected.

45. The apparatus as claimed in claim 43 or 44 including means connected to said pod microprocessor and said main memory means responsive to said clock signals from said microprocessor controlled device switch said pod microprocessor between said first and second operational states according to said one of said predetermined sets of instructions.

46. The apparatus as claimed in claim 43 or 44 including a generator connected to said interconnection means for providing periodic signals for continuously refreshing dynamic circuit means in said microprocessor controlled device when said pod microprocessor is in said first operational state.

47. The apparatus as claimed in claim 43 or 44 including driveability sensing means connected to said interconnection means for determining which and how said predetermined signals provided by said main processor means is provided by said interconnection means to said microprocessor controlled device.

48. The apparatus as claimed in claim 43 or 44 including drivability means for determining if all of said predetermined signals have been provided by said interconnection means to said microprocessor controlled device and means in said drivability means providing an indication when said predetermined signals are not provided.

49. The apparatus as claimed in claim 43 or 44 including operator controllable means connected to said apparatus processor means for selectively providing a predetermined sequence of signals to and receiving response signals to said predetermined sequence signals from said microprocessor controlled device.

50. The apparatus as claimed in claim 43 or 44 including power sensing means connected to said interconnection means responsive to the lack of said predetermined signals and clock signals from said clock in said microprocessor controlled device to provide an indication of a failure of a power supply in said microprocessor controlled device.

51. The apparatus as claimed in claim 43 or 44 including resistor and diode means connected to said interconnection means to limit the value of said predetermined signals and said signals from said microprocessor controlled device and to stimulate the impedance of said removed microprocessor.

52. The apparatus as claimed in claim 43 or 44 including probe means operatively connected to said memory means to inject controlled duration signals indicative of a duality of logic levels at selected locations and said microprocessor controlled device when said pod microprocessor is operable in said second operational state, said probe means including means for sensing logic levels at said selected locations after injecting said signals.

53. The apparatus as claimed in claim 43 or 44 including probe means operatively connected to said main memory means and said main processor means responsive to said predetermined set of instructions to provide controlled duration signals indicative of logic levels at selected locations in said microprocessor controlled device when said pod microprocessor is operable in said second operational state, said probe means including means for sensing and indicating the presence of a plurality of logic levels at selected locations after injecting said signals.

54. The apparatus as claimed in claim 43 or 44 including probe means operatively connected to said main memory means for sensing and retaining indications of signals at selected locations in said microprocessor controlled device caused by said stimulation signals.

55. The apparatus as claimed in claim 43 or 44 including probe means operatively connected to said main memory means in said pod microprocessor responsive to said pod microprocessor operating in said first or second operational state to selectively provide signals to said selected locations in said microprocessor controlled device in said first or second operational state or both.

56. The apparatus as claimed in claim 43 or 44 including probe means operatively connected to said main memory means and including means operatively associated with said main memory means and said probe means for causing said pod microprocessor means to provide one of said predetermined signals for detection of said signal by said probe means at one of said selected locations in said microprocessor controlled device when said pod microprocessor is operable in said second operational state.

* * * * *

UNITED STATES PATENT AND TRADEMARK OFFICE
CERTIFICATE OF CORRECTION

PATENT NO. : B1 4,455,654  
DATED : April 30, 1991  
INVENTOR(S) : Bhaskar et al.

Page 1 of 4

It is certified that error appears in the above-indentified patent and that said Letters Patent is hereby corrected as shown below:

On the title page, Item [56] Under References Cited, Other Public ____

Article entitled *Analyzer + Emulation = Faster Board Testing*, by David G. West, published in <u>Electronic Design</u> on October 11, 1980;

Technical Bulletin, *M6800 MICROCOMPUTER*, System Design Data, published by Motorola Semiconductor Products, Inc., 1976;

SYNERTEK 1981-1982 *DATA CATALOG, RAM, I/0, TIMER ARRAY SY6532*;

Technical Bulletin, *8255A/8255A-5, Programmable Peripheral Interface*, published by Intel, 1979;

*MICROSYSTEM ANALYZER USERS MANUAL*, Millennium Systems Inc., Cupertino, California;

UNITED STATES PATENT AND TRADEMARK OFFICE
CERTIFICATE OF CORRECTION

PATENT NO. : B1 4,455,654

DATED : April 30, 1991

INVENTOR(S) : Bhaskar et al

It is certified that error appears in the above-indentified patent and that said Letters Patent is hereby corrected as shown below:

*GUIDE TO TESTING MICROPROCESSOR BASED SYSTEMS AND BOARDS*, Millennium Systems, Inc., Cupertino, California;

*DIAGNOSTIC PROGRAMMING FOR MICROPROCESSOR-BASED SYSTEMS*, Barney Hordos, Millennium Systems, Inc., Cupertino, California;

*THE MICROSYSTEM ANALYZER*, Millennium Systems, Inc., Cupertino, California;

*PROGRAMMING WITH USA MICROSYSTEM ANALYZER*, Barney Hordos, Millennium Systems, Inc., Cupertino, California;

*9520 SOFTWARE DEVELOPMENT SYSTEM - PRODUCT DESCRIPTION*, Millennium Systems, Inc., Cupertino, California;

*9508 MICROSYSTEM EMULATOR - PRODUCT BRIEF*, Millennium Systems, Inc., Cupertino, California;

*9508 MICROSYSTEM EMULATOR - PRODUCT DESCRIPTION*, Millennium Systems, Inc., Cupertino, California;

*9520 SOFTWARE DEVELOPMENT SYSTEM - PRODUCT BRIEF*, Millennium Systems, Inc., Cupertino, California;

UNITED STATES PATENT AND TRADEMARK OFFICE
CERTIFICATE OF CORRECTION

PATENT NO. : B1 4,455,654           Page 3 of 4
DATED : April 30, 1991
INVENTOR(S) : Bhaskar et al It is certified that error appears in the above-indentified patent and that said Letters Patent is hereby corrected as shown below:

Schematics of the Millennium MicroSystem Analyzer, including:

a. "Z80 Option Wiring Schematic, " 1 page;
b. "Schematic Z80 EM I/F," 2 pages;
c. "PCBA Schematic, uSA Z80 Emulator," 4 pages.

# # #

In column 2, claim 25, lines 5 and 6, please delete "responsive to said predetermined set of instructions".

In column 2, claim 58, line 44, please delete "operation" and substitute therefor -- operational --.

In column 3, claim 62, line 1, please delete "processor" and substitute therefor -- apparatus --.

In column 10, claim 95, line 47, after "by" please insert -- said --.

In column 11, claim 97, line 44, after "device" please insert -- and receive signals from said microprocessor controlled device --.

UNITED STATES PATENT AND TRADEMARK OFFICE
CERTIFICATE OF CORRECTION

PATENT NO. : B1 4,455,654

DATED : April 30, 1991

INVENTOR(S) : Bhaskar et al

It is certified that error appears in the above-indentified patent and that said Letters Patent is hereby corrected as shown below:

In column 11, claim 98, line 49, please delete "respoonses" and substitute therefor -- responses --.

In column 14, claim 104, line 54, please delete "predetemrined" and substitute therefor -- predetermined --.

In column 15, claim 105, line 8, please delete "mans" and substitute therefor -- means --.

In column 17, claim 111, lines 28 and 29, please delete "instruction" and substitute therefor -- instructions --.

Signed and Sealed this

Seventh Day of December, 1993

Attest:

BRUCE LEHMAN

Attesting Officer

Commissioner of Patents and Trademarks

REEXAMINATION CERTIFICATE (1457th)
United States Patent [19]
Bhaskar et al.

[11] B1 4,455,654
[45] Certificate Issued Apr. 30, 1991

[54] TEST APPARATUS FOR ELECTRONIC ASSEMBLIES EMPLOYING A MICROPROCESSOR

[75] Inventors: Kasi S. Bhaskar, Edmonds; Alden J. Carlson, Bothell, both of Wash.; Alastair N. Couper, Honolulu, Hi.; Dennis L. Lambert, Bothell; Marshall H. Scott, Woodinville, both of Wash.

[73] Assignee: John Fluke Mfg. Co., Inc.

Reexamination Request:
No. 90/001,763, Apr. 26, 1989

Reexamination Certificate for:
Patent No.: 4,455,654
Issued: Jun. 19, 1984
Appl. No.: 270,926
Filed: Jun. 5, 1981

[51] Int. Cl.$^5$ .................................... G06F 11/22
[52] U.S. Cl. .................... 371/16.2; 371/22.6
[58] Field of Search ............... 371/16.2, 22.6

[56] References Cited

U.S. PATENT DOCUMENTS

| | | | |
|---|---|---|---|
| Re. 31,828 | 2/1985 | Raymond et al. | 371/20 |
| 3,832,535 | 8/1974 | De Vito | 371/27 |
| 3,882,455 | 5/1975 | Heck et al. | 371/9.1 |
| 3,922,537 | 11/1975 | Jackson | 371/15.1 |
| 3,931,506 | 1/1976 | Borelli et al. | 371/22.1 |
| 4,055,801 | 10/1977 | Pike et al. | 324/73 R |
| 4,070,565 | 1/1978 | Borrelli | 371/22.6 |
| 4,102,491 | 7/1978 | De Vito et al. | 371/15.1 |
| 4,176,258 | 11/1979 | Jackson | 371/68.1 |
| 4,176,780 | 12/1979 | Sacher et al. | 371/25.1 |
| 4,194,113 | 3/1990 | Fulks et al. | 371/22.4 |
| 4,195,258 | 3/1980 | Yen | 324/73 AT |
| 4,216,539 | 8/1980 | Raymond et al. | 371/20 |
| 4,380,070 | 4/1983 | Steiner | 371/20 |
| 4,385,349 | 5/1983 | Ashford et al. | 364/184 |
| 4,397,021 | 8/1983 | Lloyd et al. | 371/20 |
| 4,402,055 | 8/1983 | Lloyd et al. | 364/579 |
| 4,484,329 | 11/1984 | Slakma et al. | 371/25 |
| 4,500,993 | 2/1985 | Jacobson | 371/16 |

FOREIGN PATENT DOCUMENTS

53-026545 3/1978 Japan.
54-004036 1/1979 Japan.
54-152633 10/1979 Japan.
2019012A 4/1979 United Kingdom.

OTHER PUBLICATIONS

Tektronix 8001/8002A Real-Time Prototype Analyzer Manual, Tektronix, Inc., Beaverton, Oreg., Mar. 1979. 8001/8002A RPTA Users, "General Information, Introduction to the RPTA," pp. 1-1 to 1-29.
Chan, "Easy-to-Use Signature Analyzer Accurately Troubleshoots Complex Logic Ckts.", pp. 9-14 (publisher & date unknown).

*Primary Examiner*—David H. Malzahn

[57] ABSTRACT

A test system for functionally testing and troubleshooting microprocessor-based systems and assemblies is disclosed wherein the test system is connected in place of the microprocessor circuit of the unit being tested (UUT). The test system is itself a microprocessor-based system and includes a microprocessor circuit which is supplied with the UUT clock signal and is the same type of microprocessor circuit as is utilized by the UUT. The test system periodically switches this microprocessor into signal communication with the UUT for a single UUT bus cycle to perform UUT read or write operations. During remaining time periods, the test system microprocessor circuit is in signal communication with the remaining portion of the test system to analyze data obtained from the UUT bus during the previous UUT write or read operation and to establish the signals to be used in the next UUT write or read operation. Various test sequences are provided for testing the UUT bus, RAM, ROM, and write-responsive I/O registers. In addition, a mode of operation is provided wherein the test system interrogates a fully functional assembly of the type to be tested to derive a memory map and test parameters that permit the test system to perform RAM, ROM, and I/O tests without prior knowledge of the UUT operational sequence or allocation of address space. A test probe provides a visual indication that the logic level at a monitored circuit node is high, low, invalid, or is a sequence of pulses of all three logic levels. The test probe also provides for injection of logical high pulses, logical low pulses or an alternating pulse sequence of high and low pulses. Probe logic level detection and pulse injection can be asynchronous or can be selectively synchronized so that logic level detection or pulse injection occurs with each UUT write or read operation.

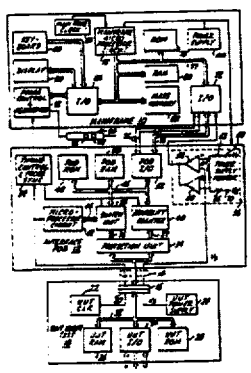

levels at selected locations in said processor controlled device.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–14, 16 and 43–56 is confirmed.

Claims 15 and 29–42 are cancelled.

Claims 17–28 are determined to be patentable as amended.

New Claims 57–111 are added and determined to be patentable.

17. The apparatus as claimed in claim [15 or] *16* wherein said apparatus processor means includes means responsive to sequential signals in said processor controlled device to change said apparatus processor means between said first and second operational states.

18. The apparatus as claimed in claim [15 or] *16*, wherein said processor controlled device includes dynamic circuit *control* means, said apparatus including generator means connected to said interconnection means for providing periodic signals to continuously refresh said dynamic circuit means in said processor controlled device.

19. The apparatus as claimed in claim [15 or] *16* including drivability sensing means connected to said interconnection means for determining if said predetermined signals provided by said apparatus processor means are provided by said interconnection means to said processor controlled device.

20. The apparatus as claimed in claim [15 or] *16* including drivability means for determining which of said predetermined signals have been provided by said interconnection means to said processor controlled device.

21. The apparatus as claimed in claim [15 or] *16* wherein said apparatus processor means includes means for selectively providing input signals to said processor controlled device and receiving signals therefrom when said apparatus processor means is in said second operational state.

22. The apparatus as claimed in claim [15 or] *16* including power sensing means connected to said interconnection means responsive to the lack of said predetermined signals to provide an indication of the failure of a power supply in said processor controlled device.

23. The apparatus as claimed in claim [15 or] *16* including limiting means connected to said interconnection means to limit the value of said predetermined signals and of said set of responses from said processor controlled device.

24. The apparatus as claimed in claim [15 or] *16* including probe means operatively connected to said memory means to provide signals indicative of logic levels at selected locations in said processor controlled device.

25. The apparatus as claimed in claim [15 or] *16* including probe means operatively connected to said memory means responsive to said predetermined set of instructions to provide signals indicative of logic levels at selected locations in said processor controlled device.

26. The apparatus as claimed in claim [15 or] *16* including probe means operatively connected to said memory means for providing signal pulses to selected locations in said processor controlled device.

27. The apparatus as claimed in claim [15 or] *16* including probe means operatively connected to said memory means and said apparatus processor means responsive to said apparatus processor means operating in said first or second state to selectively provide signals to selected locations in said processor controlled device in said first or second state or both.

28. The apparatus as claimed in claim [15 or] *16* including probe means operatively connected to said memory means and including means operatively associated with said memory means and said probe means to cause said apparatus processor means to provide one of said predetermined signals for detection of said signal by said probe means at selected locations in said processor controlled device.

*57. The test system of claim 1 wherein said second microprocessor circuit, said memory means and said interconnection means each include a respective set of data, address, and control busses, and wherein said switching means selectively couples the data, address and control busses of said second microprocessor to all three of the respective data, address and control busses of said memory means in said first operational state, and to all three of the respective data, address and control busses of said interconnection means in said second operational state.*

*58. The test system of claim 1 wherein said second microprocessor circuit, said memory means and said interconnection means each include a respective set of data, address, and control busses, and wherein said switching means selectively isolates the data, address and control busses of said second microprocessor from all three of the respective data, address and control busses of said interconnection means in said first operation state, and from all three of the respective data, address and control busses of said memory means in said second operational state.*

*59. The test system of claim 1 wherein the microprocessor circuit in said microprocessor-based assembly is functionally removed from said assembly before said interconnection means is connected to said microprocessor-based assembly.*

*60. The test system of claim 1 wherein the microprocessor circuit in said microprocessor-based assembly is physically removed from said assembly before said interconnection means is connected to said microprocessor-based assembly.*

*61. The apparatus of claim 16 wherein said apparatus processor means, said memory means and said interconnection means each include a respective set of data, address, and control busses, and wherein the data, address and control busses of said apparatus processor means are isolated from all three of the respective data, address and control busses of said interconnection means in said first operational state, and wherein the data, address and control busses of said apparatus processor means are isolated from all three of the respective data, address and control busses of said memory means in said second operational state.*

62. The processor of claim 16 wherein said apparatus processor means includes a microprocessor.

63. The apparatus of claim 16 wherein said processor controlled device includes a microprocessor connected through a set of electrical contacts, and wherein said interconnection means connects said apparatus to said processor controlled device by connecting said interconnection means to said electrical contacts.

64. The apparatus of claims 43 or 44 wherein the microprocessor in said microprocessor controlled device is physically removed from said device before said interconnection means is connected to said microprocessor controlled device.

65. The apparatus of claims 43 or 44 wherein the microprocessor in said microprocessor controlled device is functionally removed from said device before said interconnection means is connected to said microprocessor controlled device.

66. The apparatus of claims 43 or 44 wherein said pod microprocessor, said pod memory means and said interconnection means each include a respective set of data, address, and control busses, and wherein said switching means selectively isolates the data, address, and control busses of said pod microprocessor from all three of the respective data, address and control busses of said interconnection means in said first operational state, and from all three of the respective data, address and control busses of said pod memory in said second operational state.

67. Apparatus for determining a set of responses for a faultless processor controlled device comprising:
   memory means containing a predetermined set of instructions;
   interconnection means for connecting said apparatus to said processor controlled device;
   apparatus processor means connected to said memory means and said interconnection means and alternating between (a) a first operational state wherein said apparatus processor means is in communication with said memory means and isolated from said processor controlled device to selectively receive said predetermined set of instructions from said memory means and provide said set of responses from said processor controlled device to said memory means and (2) a second operational state wherein said apparatus processor means is in communication with said processor controlled device and isolated from said memory means to selectively execute said set of instructions by providing predetermined signals to said processor controlled device and receiving signals from said processor controlled device as said set of responses;
   timing means responsive to a clock signal supplied by said processor controlled device for maintaining said apparatus processor means in said second operational state for a single bus cycle; and
   means included in said memory means to retain said set of responses provided by said apparatus processor means as said set of responses for said faultless processor controlled device.

68. The apparatus of claim 67 wherein said processor controlled device includes dynamic circuit means, said apparatus including generator means connected to said interconnection means for providing periodic signals to continuously refresh said dynamic circuit means in said processor controlled device.

69. The apparatus of claim 67 further including drivability sensing means connected to said interconnection means for determining if said predetermined signals provided by said apparatus processor means are provided by said interconnection means to said processor controlled device.

70. The apparatus of claim 67 wherein said apparatus processor means, said memory means and said interconnection means each include a respective set of data, address, and control busses, and wherein said switching means selectively isolates the data, address and control busses of said apparatus processor means from all three of the respective data, address and control busses of said interconnection means in said first operational state, and from all three of the respective data, address and control busses of said memory means in said second operational state.

71. The apparatus of claim 67 wherein said apparatus processor means includes a microprocessor.

72. The apparatus of claim 67 wherein said processor controlled device includes a microprocessor connected through a set of electrical contacts, and wherein said interconnection means connects said apparatus to said processor controlled device by connecting said interconnection means to said electrical contacts.

73. Apparatus for determining a set of responses for a faultless microprocessor controlled device comprising:
   memory means including a mainframe memory containing a sequence of microprocessor-independent test commands each including a predetermined set of instructions that are applicable to a variety of microprocessor types but can be adapted to the type of instructions used by the specific microprocessor in said microprocessor controlled device, said memory means further including a pod memory containing information that is specific to the microprocessor in said microprocessor controlled device for allowing said memory means to provide instructions of the type used by the microprocessor in said microprocessor controlled device;
   interconnection means for connecting said apparatus to said microprocessor controlled device;
   a mainframe processor operably connected to said memory means for causing said memory means to provide instructions of the type used by the microprocessor in said microprocessor controlled device; and
   an apparatus microprocessor pod operably connected to said memory means, said mainframe processor and said interconnection means operable alternately in (1) a first operational state wherein said apparatus microprocessor pod is in communication with said memory means and said mainframe processor and isolated from said microprocessor controlled device to selectively receive said predetermined set of instructions from said memory means and provide a set of responses to said memory means, and (2) a second operational state wherein said apparatus microprocessor pad is in communication with said microprocessor controlled device and isolated from said memory means to selectively execute said set of instructions by providing predetermined signals to said microprocessor controlled device and receiving signals from said microprocessor controlled device as said set of responses; and
   recording means in said memory means to retain said set of responses as said set of responses for said faultless microprocessor controlled device.

74. Apparatus for detecting faults in a microprocessor controlled device comprising:
   memory means including a mainframe memory containing a sequence of microprocessor-independent test commands each including a predetermined set of instructions that are applicable to a variety of microprocessor types but can be adapted to the type of instructions used by the specific microprocessor in said microprocessor controlled device and a predetermined set of responses that are characteristic of said microprocessor controlled device, said memory means further including a pod memory containing information that is specific to the microprocessor in said microprocessor controlled device for allowing said memory means to provide instructions of the type used by the microprocessor in said microprocessor controlled device;

interconnection means for connecting said apparatus to said microprocessor controlled device;

a mainframe processor operably connected to said memory means for causing said memory means to provide instructions of the type used by the microprocessor in said microprocessor controlled device;

an apparatus microprocessor pod operably connected to said memory means, said mainframe processor and said interconnection means, said apparatus microprocessor pod including an apparatus microprocessor alternating between (1) a first operational state in communication with said memory means and said mainframe processor, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receiving signals therefrom as said set of responses; and comparison means in said memory means for comparing said predetermined set of responses and said set of responses and providing a visual fault indication when said responses differ.

75. The apparatus of claim 73 or 74 further including switching means in said apparatus microprocessor pod responsive to clock signals from a clock in said microprocessor controlled device to change said apparatus microprocessor pod between said first and second operational states according to said predetermined set of instructions from said memory means.

76. The apparatus of claim 73 or 74 wherein said microprocessor controlled device includes dynamic circuit means, said apparatus including generator means connected to said interconnection means for providing periodic signals to continuously refresh said dynamic circuit means in said microprocessor controlled device.

77. The apparatus of claim 73 or 74 further including drivability sensing means in said apparatus microprocessor pod connected to said interconnection means for determining which of said predetermined signals provided by said apparatus microprocessor pod are provided by said interconnection means to said microprocessor controlled device.

78. The apparatus of claim 73 or 74 wherein said apparatus microprocessor pod, said memory means and said interconnection means each include a respective set of data, address, and control busses, and wherein said switching means selectively isolates the data, address and control busses of said apparatus microprocessor pod from all three of the respective data, address and control busses of said interconnection means in said first operational state, and from all three of the respective data, address and control busses of said memory means in said second operational state.

79. The apparatus of claim 73 or 74 wherein said microprocessor controlled device includes a microprocessor connected through a set of electrical contacts, and wherein said interconnection means connects said apparatus to said microprocessor controlled device by connecting said interconnection means to said electrical contacts.

80. A test system for functionally testing a microprocessor-based assembly of the type wherein a microprocessor circuit communicates with at least one of a random access memory unit, a read-only memory unit and an input/output register via an interconnection bus, and a clock circuit coupling a periodic clock signal to said microprocessor circuit to establish a bus cycle of a predetermined length, said test system comprising:

memory means containing a predetermined set of instructions;

processor means adapted to be controlled by said predetermined set of instructions;

interconnection means for connecting said test system to said microprocessor-based assembly being tested, said interconnection means including means for coupling said clock signal to said processor means; and switching means for selectively coupling said processor means between a first operational state wherein said processor means is in signal communication with said memory means to receive said predetermined instructions therefrom and a second operational state wherein said processor means is in signal communication with said interconnection means to supply signals to and receive signals from said interconnection bus of said microprocessor-based assembly being tested, said switching means including timing means responsive to said clock signal supplied by said microprocessor-based assembly for maintaining said processor means in said second operational state for a single bus cycle.

81. The test system of claim 80 further including register means connected to said interconnection means, said register means storing a signal appearing on said interconnection means responsive to an applied register control signal, said switching means including means for supplying said register control signal to said register during said second operational state at the time said processor means supplies signals to said interconnection bus of said microprocessor-based assembly being tested.

82. The test system of claim 80 wherein said processor means, said memory means and said interconnection means each include a respective set of data, address, and control busses, and wherein said switching means selectively couples the data, address and control busses of said processor means to all three of the respective data, address and control busses of said memory means in said first operational state, and to all three of the respective data, address and control busses of said interconnection means in said second operational state.

83. The test system of claim 80 wherein said processor means, said memory means and said interconnection means each include a respective set of data, address, and control busses, and wherein said switching means selectively isolates the data, address and control busses of said processor means from all three of the respective data, address and control busses of said interconnection means in said first operational state, and from all three of the respective data, address and control busses of said memory means in said second operational state.

84. The test system of claim 80 wherein said processor means includes a microprocessor.

85. The test system of claim 80 wherein the microprocessor circuit in said microprocessor-based assembly is connected through a set of electrical contacts, and wherein said interconnection means connects said test system to said microprocessor-based assembly by connecting said interconnection means to said electrical contacts.

86. The test system of claim 85 wherein said microprocessor circuit in said microprocessor-based assembly is functionally removed from said assembly before said interconnection means is connected to said microprocessor-based assembly.

87. The test system of claim 85 wherein the microprocessor circuit in said microprocessor-based assembly is physically removed from said assembly before said interconnection means is connected to said microprocessor-based assembly.

88. Apparatus for determining a set of responses for a faultless processor controlled device comprising:
  memory means containing a predetermined set of instructions;
  interconnection means for connecting said apparatus to said processor controlled device;
  apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
  means responsive to sequential signals in said processor controlled device to change said apparatus processor means between said first and second operational states; and
  means included in said memory means to retain said set of responses provided by said apparatus processor means as said set of responses for said faultless processor controlled device.

89. Apparatus for determining a set of responses for a faultless processor controlled device having dynamic circuit means, comprising:
  memory means containing a predetermined set of instructions;
  interconnection means for connecting said apparatus to said processor controlled device;
  generator means connected to said interconnection means for providing periodic signals to continuously refresh said dynamic circuit means in said processor controlled device;
  apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses; and
  means included in said memory means to retain said set of responses provided by said apparatus processor means as said set of responses for said faultless processor controlled device.

90. Apparatus for determining a set of responses for a faultless processor controlled device comprising:
  memory means containing a predetermined set of instructions;
  interconnection means for connecting said apparatus to said processor controlled device;
  apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
  drivability sensing means connected to said interconnection means for determining if said predetermined signals provided by said apparatus processor means are provided by said interconnection means to said processor controlled device; and
  means included in said memory means to retain said set of responses provided by said apparatus processor means as said set of responses for said faultless processor controlled device.

91. Apparatus for determining a set of responses for a faultless processor controlled device comprising:
  memory means containing a predetermined set of instructions;
  interconnection means for connecting said apparatus to said processor controlled device;
  apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means in in communication with said processor controlled device and isolated from said memory means to selectively execute said set of instructions by providing predetermined signals to said processor controlled device and receive signals from said processor controlled device as said set of responses;
  drivability means for determining which of said predetermined signals have been provided by said interconnection means to said processor controlled device; and
  means included in said memory means to retain said set of responses provided by said apparatus processor means as said set of responses for said faultless processor controlled device.

92. Apparatus for determining a set of responses for a faultless processor controlled device comprising:
memory means containing a predetermined set of instructions;
interconnection means for connecting said apparatus to said processor controlled device;
apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
power sensing means connected to said interconnection means responsive to the lack of said predetermined signals to provide an indication of the failure of a power supply in said processor controlled device; and
means included in said memory means to retain said set of responses provided by said apparatus processor means as said set of responses for said faultless processor controlled device.

93. Apparatus for determining a set of responses for a faultless processor controlled device comprising:
memory means containing a predetermined set of instructions;
interconnection means for connecting said apparatus to said processor controlled device;
apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
means included in said memory means to retain said set of responses provided by said apparatus processor means as said set of responses for said faultless processor controlled device; and
probe means operatively connected to said memory means for providing signal pulses to selected locations in said processor controlled device.

94. Apparatus for determining a set of responses for a faultless processor controlled device comprising:
memory means containing a predetermined set of instructions;
interconnection means for connecting said apparatus to said processor controlled device;
apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
means included in said memory means to retain said set of responses provided by said apparatus processor means as said set of responses for said faultless processor controlled device; and
probe means operatively connected to said memory means and said apparatus processor means responsive to said apparatus processor means operating in said first or second state to selectively provide signals to selected locations in said processor controlled device in said first or second state or both.

95. Apparatus for determining a set of responses for a faultless processor controlled device comprising:
memory means containing a predetermined set of instructions;
interconnection means for connecting said apparatus to said processor controlled device;
apparatus processor means connected to said memory means and said interconnection means and alternating between (1) a first operational state wherein said apparatus processor means is in communication with said memory means and isolated from said processor controlled device to selectively receive said predetermined set of instructions from said memory means and provide said set of responses obtained from said processor controlled device to said memory means and (2) a second operational state wherein said apparatus processor means is in communication with said processor controlled device and isolated from said memory means to selectively execute said set of instructions by providing predetermined signals to said processor controlled device and receive signals from said processor controlled device as said set of responses;
means included in said memory means to retain said set of responses provided by apparatus processor means as said set of responses for said faultless processor controlled device; and
probe means operatively connected to said memory means and including means operatively associated with said memory means and said probe means to cause said apparatus processor means to provide one of said predetermined signals for detection of said signal by said probe means at selected locations in said processor controlled device.

96. Apparatus for determining a set of responses for a faultless microprocessor controlled device comprising:
memory means containing a predetermined set of instructions;
interconnection means for connecting said apparatus to said microprocessor controlled device;
an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;

switching means in said apparatus microprocessor pod responsive to clock signals from a clock in said microprocessor controlled device to change said apparatus microprocessor pod between said first and second operation states according to said predetermined set of instructions from said memory means; and recording means in said memory means to retain said set of responses as said set of responses for said faultless microprocessor controlled device.

97. Apparatus for determining a set of responses for a faultless microprocessor controlled device having dynamic circuit means, comprising:

memory means containing a predetermined set of instructions;

interconnection means for connecting said apparatus to said microprocessor controlled device;

generator means in said microprocessor pod connected to said interconnection means for providing periodic signals for continuously refreshing said dynamic circuit means in said microprocessor controlled device;

an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device as said set of responses; and recording means in said memory means to retain said set of responses as said set of responses for said faultless microprocessor controlled device.

98. Apparatus for determining a set of respoonses for a faultless microprocessor controlled device comprising:

memory means containing a predetermined set of instructions;

interconnection means for connecting said apparatus to said microprocessor controlled device;

an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;

drivability sensing means in said apparatus microprocessor pod connected to said interconnection means for determining which of said predetermined signals provided by said apparatus microprocessor pod are provided by said interconnection means to said microprocessor controlled device; and recording means in said memory means to retain said set of responses as said set of responses for said faultless microprocessor controlled device.

99. Apparatus for determining a set of responses for a faultless microprocessor controlled device comprising:

memory means containing a predetermined set of instructions;

interconnection means for connecting said apparatus to said microprocessor controlled device;

an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;

drivability means in said apparatus microprocessor pod for determining if all of said predetermined signals have been provided by said interconnection means to said microprocessor controlled device; and recording means in said memory means to retain said set of responses as said set of responses for said faultless microprocessor controlled device.

100. Apparatus for determining a set of responses for a faultless microprocessor controlled device comprising:

memory means containing a predetermined set of instructions;

interconnection means for connecting said apparatus to said microprocessor controlled device;

an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;

probe means operatively connected to said memory means responsive to said predetermined set of instructions to provide signals indicative of logic levels at selected locations in said microprocessor controlled device; and recording means in said memory means to retain said set of responses as said set of responses for said faultless microprocessor controlled device.

101. Apparatus for determining a set of responses for a faultless microprocessor controlled device comprising:
  memory means containing a predetermined set of instructions;
  interconnection means for connecting said apparatus to said microprocessor controlled device;
  an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;
  recording means in said memory means to retain said set of responses as said set of responses for said faultless microprocessor controlled device; and
  probe means operatively connected to said memory means for providing signal pulses to selected locations in said microprocessor controlled device.

102. Apparatus for determining a set of responses for a faultless microprocessor controlled device comprising:
  memory means containing a predetermined set of instructions;
  interconnection means for connecting said apparatus to said microprocessor controlled device;
  an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;
  recording means in said memory means to retain said set of responses as said set of responses for said faultless microprocessor controlled device; and
  probe means operatively connected to said memory means and said apparatus processor pod responsive to said apparatus microprocessor pod operating in said first or second operational state to selectively provide signals to selected locations in said microprocessor controlled device in said first or second operational state or both.

103. Apparatus for determining a set of responses for a faultless microprocessor controlled device comprising:
  memory means containing a predetermined set of instructions;
  interconnection means for connecting said apparatus to said microprocessor controlled device;
  an apparatus microprocessor pod connected to said memory means and said interconnection means operable alternately in (1) a first operational state wherein said apparatus microprocessor pod is in communication with said memory means and isolated from said microprocessor controlled device to selectively receive said predetermined set of instructions from said memory means and provide said set of responses to said memory means and (2) a second operational state wherein said apparatus microprocessor is in communication with said microprocessor controlled device and isolated from said memory means to selectively execute said set of instructions by providing predetermined signals to said microprocessor controlled device and receive signals from said microprocessor controlled device as said set of responses;
  recording means in said memory means to retain said set of responses as said set of responses for said faultless microprocessor controlled device; and
  probe means operatively connected to said memory means and including means operatively associated with said memory means and said probe means for said memory means to cause said apparatus microprocessor pod to provide one of said predetermined signals for detection of said signal by said probe means at one of said selected locations in said microprocessor controlled device.

104. Apparatus for detecting faults in a microprocessor controlled device comprising:
  memory means containing a predetermined set of instructions and a predetermined set of responses;
  interconnection means for connecting said apparatus to said microprocessor controlled device;
  an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;
  switching means in said apparatus microprocessor pod responsive to clock signals from a clock in said microprocessor controlled device to change said apparatus microprocessor pod between said first and second operational states according to said predetemrined set of instructions from said memory means; and
  comparison means in said memory means for comparing said predetermined set of responses and said set of responses and providing a visual fault indication when said responses differ.

105. Apparatus for detecting faults in a microprocessor controlled device having dynamic circuit means, comprising:
  memory means containing a predetermined set of instructions and a predetermined set of responses;
  interconnection means for connecting said apparatus to said microprocessor controlled device;
  generator means in said microprocessor pod connected to said interconnection means for providing periodic signals for continuously refreshing said dynamic circuit means in said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses; and comparison means in said memory means for comparing said predetermined set of responses and said set of responses and providing a visual fault indication when said responses differ.

106. Apparatus for detecting faults in a microprocessor controlled device comprising:

memory means containing a predetermined set of instructions and a predetermined set of responses;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;

drivability sensing means in said apparatus microprocessor pod connected to said interconnection means for determining which of said predetermined signals provided by said apparatus microprocessor pod are provided by said interconnection means to said microprocessor controlled device; and comparison means in said memory means for comparing said predetermined set of responses and said set of responses and providing a visual fault indication when said responses differ.

107. Apparatus for detecting faults in a microprocessor controlled device comprising:

memory means containing a predetermined set of instructions and a predetermined set of responses;

drivability means in said apparatus microprocessor pod for determining if all of said predetermined signals have been provided by said interconnection means to said microprocessor controlled device;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses; and comparison means in said memory means for comparing said predetermined set of responses and said set of responses and providing a visual fault indication when said responses differ.

108. Apparatus for detecting faults in a microprocessor controlled device comprising:

memory means containing a predetermined set of instructions and a predetermined set of responses;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;

comparison means in said memory means for comparing said predetermined set of responses and said set of responses and providing a visual fault indication when said responses differ; and probe means operatively connected to said memory means responsible to said predetermined set of instructions to provide signals indicative of logic levels at selected locations in said microprocessor controlled device.

109. Apparatus for detecting faults in a microprocessor controlled device comprising:

memory means containing a predetermined set of instructions and a predetermined set of responses;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;

comparison means in said memory means for comparing said predetermined set of responses and said set of responses and providing a visual fault indication when said responses differ; and probe means operatively connected to said memory means for providing signal pulses to selected locations in said microprocessor controlled device.

110. Apparatus for detecting faults in a microprocessor controlled device comprising:

memory means containing a predetermined set of instructions and a predetermined set of responses;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;

comparison means in said memory means for comparing said predetermined set of responses and said set of responses and providing a visual fault indication when said responses differ; and probe means operatively connected to said memory means and said apparatus processor pod responsible to said apparatus microprocessor pod operating in said first or second operational state to selectively provide signals to selected locations in said microprocessor controlled device in said first or second operational state or both.

111. Apparatus for detecting faults in a microprocessor controlled device comprising:

memory means containing a predetermined set of instruction and a predetermined set of responses;

interconnection means for connecting said apparatus to said microprocessor controlled device;

an apparatus microprocessor pod connected to said memory means and said interconnection means, said apparatus microprocessor pod including an apparatus microprocessor alternating between (1) a first operational state in communication with said memory means, to selectively receive said predetermined set of instructions from said memory means and provide a set of responses to said memory means, and (2) a second operational state in communication with said microprocessor controlled device to selectively execute said set of instructions by providing predetermined signals to said microprocessor controlled device and receive signals therefrom as said set of responses;

comparison means in said memory means for comparing said predetermined set of responses and said set of responses and providing a visual fault indication when said responses differ; and probe means operatively connected to said memory means and including means operatively associated with said memory means and said probe means for said memory means to cause said apparatus microprocessor pod to provide one of said predetermined signals for detection of said signal by said probe means at one of said selected locations in said microprocessor controlled device.

* * * * *